(12) United States Patent
Chen et al.

(10) Patent No.: US 12,538,571 B2
(45) Date of Patent: Jan. 27, 2026

(54) TRANSISTOR GATE STRUCTURES AND METHODS OF FORMING THE SAME

(71) Applicant: Taiwan Semiconductor Manufacturing Co., Ltd., Hsinchu (TW)

(72) Inventors: Hsueh-Ju Chen, Taipei (TW); Yi Hsuan Chen, Hsinchu (TW); Jyun-Yi Wu, Hsinchu (TW); Wen-Hung Huang, Hsinchu (TW); Tsung-Da Lin, Pingtung County (TW); Jian-Hao Chen, Hsinchu (TW); Cheng-Lung Hung, Hsinchu (TW); Kuo-Feng Yu, Zhudong Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 668 days.

(21) Appl. No.: 17/703,329

(22) Filed: Mar. 24, 2022

(65) Prior Publication Data

US 2023/0163129 A1 May 25, 2023

Related U.S. Application Data

(60) Provisional application No. 63/264,388, filed on Nov. 22, 2021.

(51) Int. Cl.
*H10D 84/85* (2025.01)
*H10D 30/01* (2025.01)
(Continued)

(52) U.S. Cl.
CPC ....... *H10D 84/856* (2025.01); *H10D 30/0245* (2025.01); *H10D 30/6211* (2025.01);
(Continued)

(58) Field of Classification Search
CPC ............. H01L 27/0922; H01L 27/0924; H01L 27/0886; H01L 21/823807;
(Continued)

(56) References Cited

U.S. PATENT DOCUMENTS 9,653,537 B1 * 5/2017 Jagannathan .......... H10D 64/01
10,522,344 B2 12/2019 Cheng et al.
(Continued)

FOREIGN PATENT DOCUMENTS

CN 102084463 A 6/2011
CN 101627470 B 12/2011
TW 201919113 A 5/2019

*Primary Examiner* — Fernando L Toledo
*Assistant Examiner* — Marshall Mu-Nuo Hatfield
(74) *Attorney, Agent, or Firm* — Slater Matsil, LLP

(57) ABSTRACT

In an embodiment, a device includes: an isolation region on a substrate; a first semiconductor fin protruding above the isolation region; a first gate dielectric on a first channel region of the first semiconductor fin, the first gate dielectric including a first interfacial layer and a first high-k dielectric layer; a second semiconductor fin protruding above the isolation region; and a second gate dielectric on a second channel region of the second semiconductor fin, the second gate dielectric including a second interfacial layer and a second high-k dielectric layer, a first portion of the first interfacial layer on the first channel region having a greater thickness than a second portion of the second interfacial layer on the second channel region, the second channel region having a greater height than the first channel region.

19 Claims, 39 Drawing Sheets

(51) Int. Cl.
*H10D 30/62* (2025.01)
*H10D 62/17* (2025.01)
*H10D 84/01* (2025.01)
*H10D 84/03* (2025.01)

(52) U.S. Cl.
CPC ....... *H10D 62/292* (2025.01); *H10D 84/0167* (2025.01); *H10D 84/0193* (2025.01); *H10D 84/038* (2025.01); *H10D 84/853* (2025.01)

(58) Field of Classification Search
CPC ..... H01L 21/823821; H01L 21/823857; H01L 21/823412; H01L 21/823431; H01L 21/823462; H01L 29/1037; H01L 29/66818; H01L 29/7851; H01L 29/7854
See application file for complete search history.

(56) References Cited

U.S. PATENT DOCUMENTS

| | | |
|---|---|---|
| 2009/0321877 A1 | 12/2009 | Wang |
| 2018/0040620 A1* | 2/2018 | Ha ................... H10D 86/011 |
| 2019/0393350 A1* | 12/2019 | Thompson ........... H10D 30/014 |
| 2020/0258785 A1* | 8/2020 | Zhang ................ H10D 30/6757 |
| 2020/0273700 A1* | 8/2020 | Cheng .................. H10D 64/01 |
| 2020/0328289 A1* | 10/2020 | Cheng ................ H10D 84/0151 |
| 2021/0066292 A1* | 3/2021 | Xiao ................. H01L 21/02236 |

\* cited by examiner

TRANSISTOR GATE STRUCTURES AND METHODS OF FORMING THE SAME

PRIORITY CLAIM AND CROSS-REFERENCE

This application claims the benefit of U.S. Provisional Application No. 63/264,388, filed on Nov. 22, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
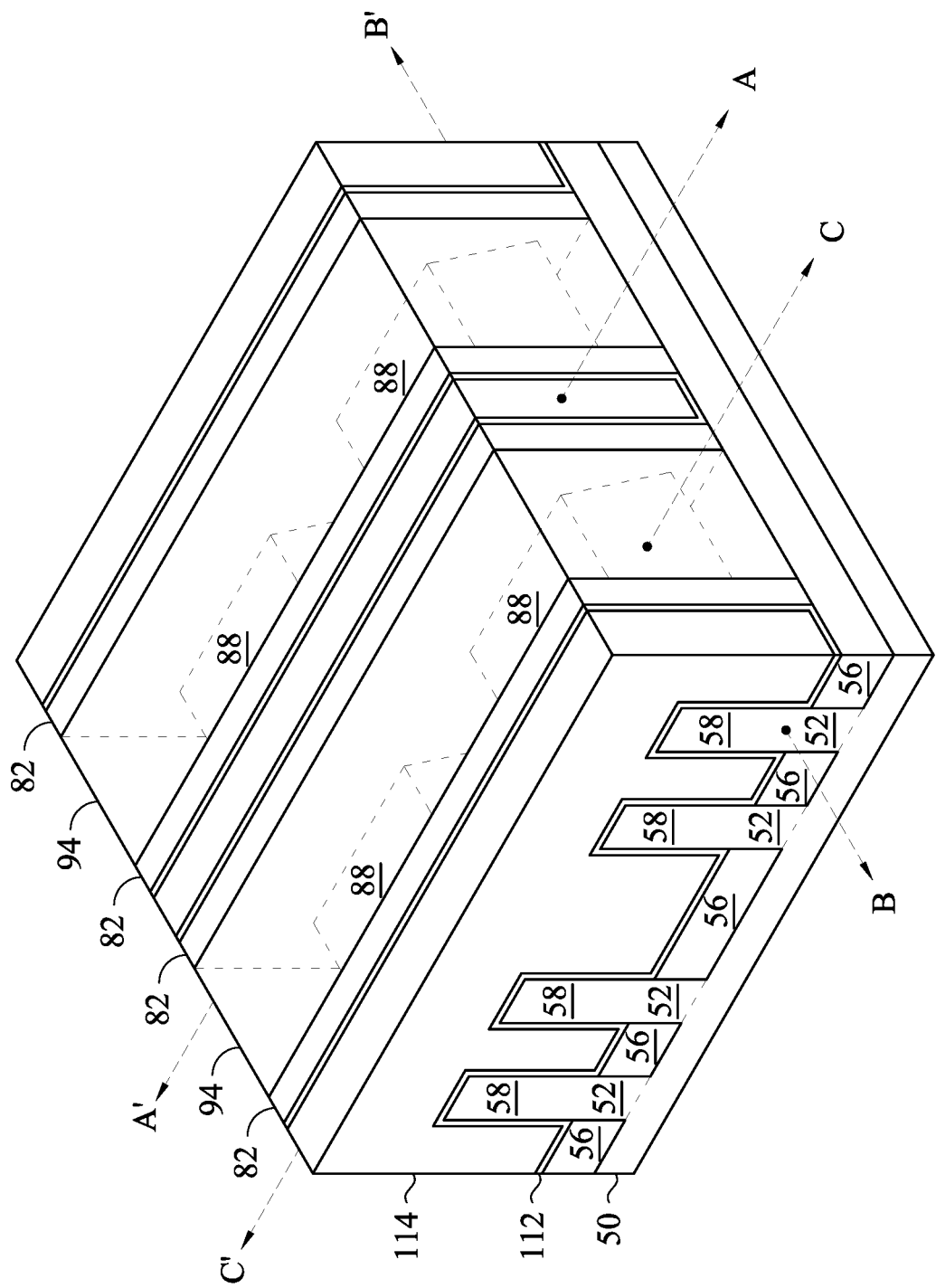
FIG. 1 illustrates an example of Fin Field-Effect Transistors (FinFETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, dummy gate dielectrics are removed during a gate replacement process, and replacement interfacial layers are formed in their place. The dummy gate dielectrics are thus not used as interfacial layers in subsequently formed replacement gates. The replacement interfacial layers may be higher quality films than the dummy gate dielectrics, because they are exposed to fewer processing steps than the dummy gate dielectrics. Further, the dummy gate dielectrics may be formed thinner than dummy gate dielectrics that are used as interfacial layers, allowing for a reduction in etching losses when removing the dummy gate dielectrics. After the replacement interfacial layers are formed, the thickness of the replacement interfacial layers in some regions (e.g., input/output regions) is increased by an anneal process. Increasing the thickness of these replacement interfacial layers can reduce the leakage current of the devices in the input/output regions. The performance of the devices may thus be improved.

FIG. 1 illustrates an example of Fin Field-Effect Transistors (FinFETs), in accordance with some embodiments. FIG. 1 is a three-dimensional view, where some features of the FinFETs are omitted for illustration clarity. The FinFETs include fins 52 extending from a substrate 50 (e.g., a semiconductor substrate), with the fins 52 acting as channel regions 58 for the FinFETs. Isolation regions 56, such as shallow trench isolation (STI) regions, are disposed between adjacent fins 52, which may protrude above and from between adjacent isolation regions 56. Although the isolation regions 56 are described/illustrated as being separate from the substrate 50, as used herein, the term "substrate" may refer to the semiconductor substrate alone or a combination of the semiconductor substrate and the isolation regions. Additionally, although the bottom portions of the fins 52 are illustrated as being single, continuous materials with the substrate 50, the bottom portions of the fins 52 and/or the substrate 50 may include a single material or a plurality of materials.

Gate dielectrics 112 are along sidewalls and over top surfaces of the fins 52. Gate electrodes 114 are over the gate dielectrics 112. Epitaxial source/drain regions 88 are disposed in opposite sides of the fin 52 with respect to the gate dielectrics 112 and gate electrodes 114. The epitaxial source/drain regions 88 may be shared between various fins 52. For example, adjacent epitaxial source/drain regions 88 may be electrically connected, such as through coalescing the epitaxial source/drain regions 88 by epitaxial growth, or through coupling the epitaxial source/drain regions 88 with a same source/drain contact.

FIG. 1 further illustrates reference cross-sections that are used in later figures. Cross-section A-A' is along a longitudinal axis of a gate electrode 114. Cross-section B-B' is along a longitudinal axis of a fin 52 and in a direction of, for example, a current flow between the epitaxial source/drain regions 88 of a FinFET. Cross-section C-C' is parallel to cross-section A-A' and extends through epitaxial source/drain regions 88 of the FinFETs. Subsequent figures refer to these reference cross-sections for clarity.

Some embodiments discussed herein are discussed in the context of FinFETs formed using a gate-last process. Some embodiments contemplate aspects used in planar devices, such as planar FETs.

FIGS. 2-19B are views of intermediate stages in the manufacturing of FinFETs, in accordance with some embodiments. FIGS. 2, 3, 4, 5A, 6A, 7A, 8A, 9A, 10A, 11A, 12A, 13A, 14A, 15A, 16A, 17A, 18A, and 19A are cross-sectional views illustrated along a similar cross-section as reference cross-section A-A' in FIG. 1. FIGS. 5B, 6B, 7B, 8B, 9B, 10B, 11B, 12B, 13B, 14B, 15B, 16B, 17B, 18B, and 19B are cross-sectional views illustrated along a similar cross-section as reference cross-section B-B' in FIG. 1. FIGS. 7C and 7D are cross-sectional views illustrated along a similar cross-section as reference cross-section C-C' in FIG. 1.

Figure 2:
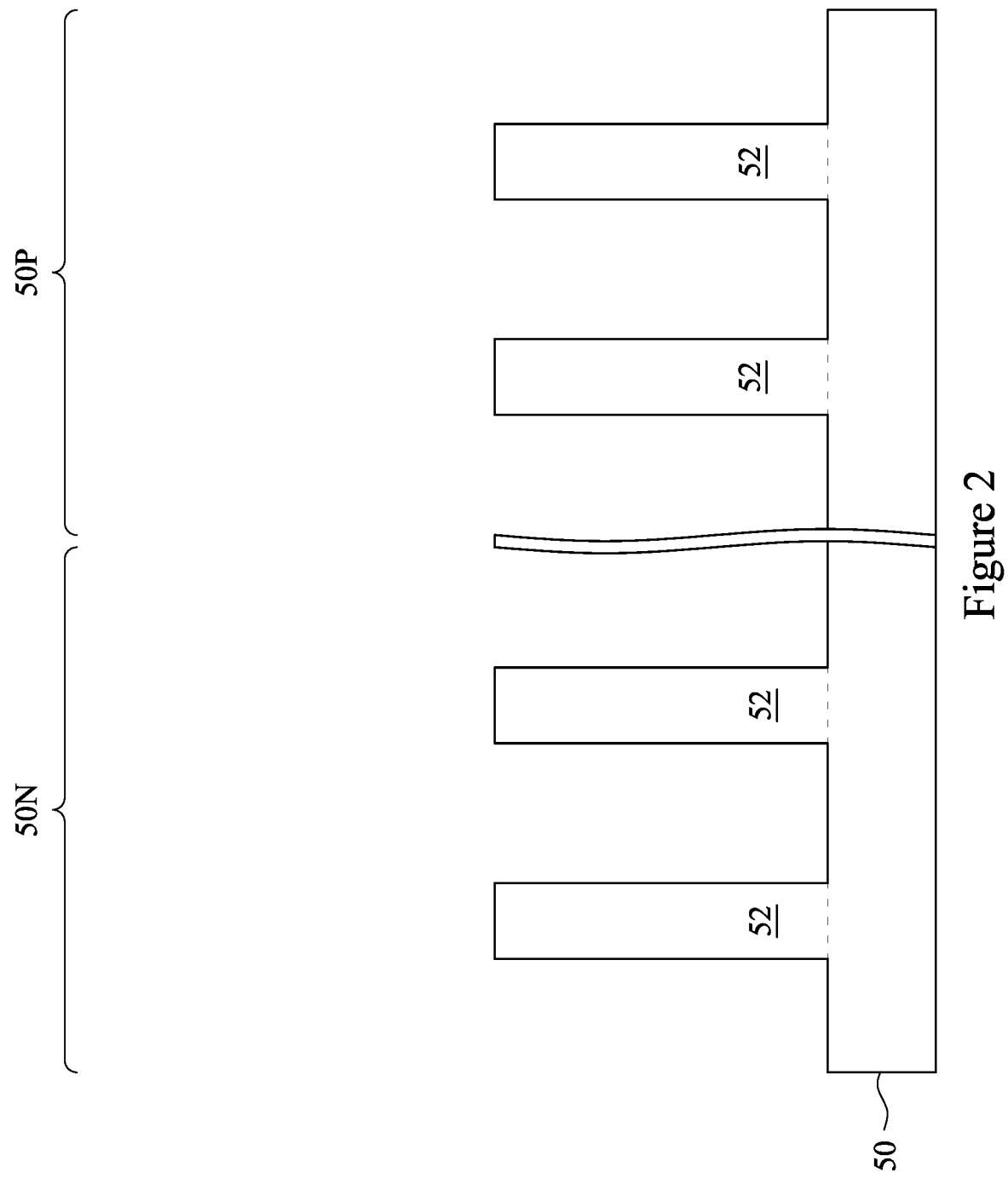
FIGS. 2-19B are views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type FinFETs, and the p-type region 50P can be for forming p-type devices, such as PMOS transistors, e.g., p-type FinFETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Fins 52 are formed in the substrate 50. The fins 52 are semiconductor strips, and may also be referred to as semiconductor fin. The fins 52 may be formed in the substrate 50 by etching trenches in the substrate 50. The etching may be any acceptable etching process, such as a reactive ion etch (RIE), neutral beam etch (NBE), the like, or a combination thereof. The etching process may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 52. In some embodiments, the mask (or other layer) may remain on the fins 52.

Figure 3:
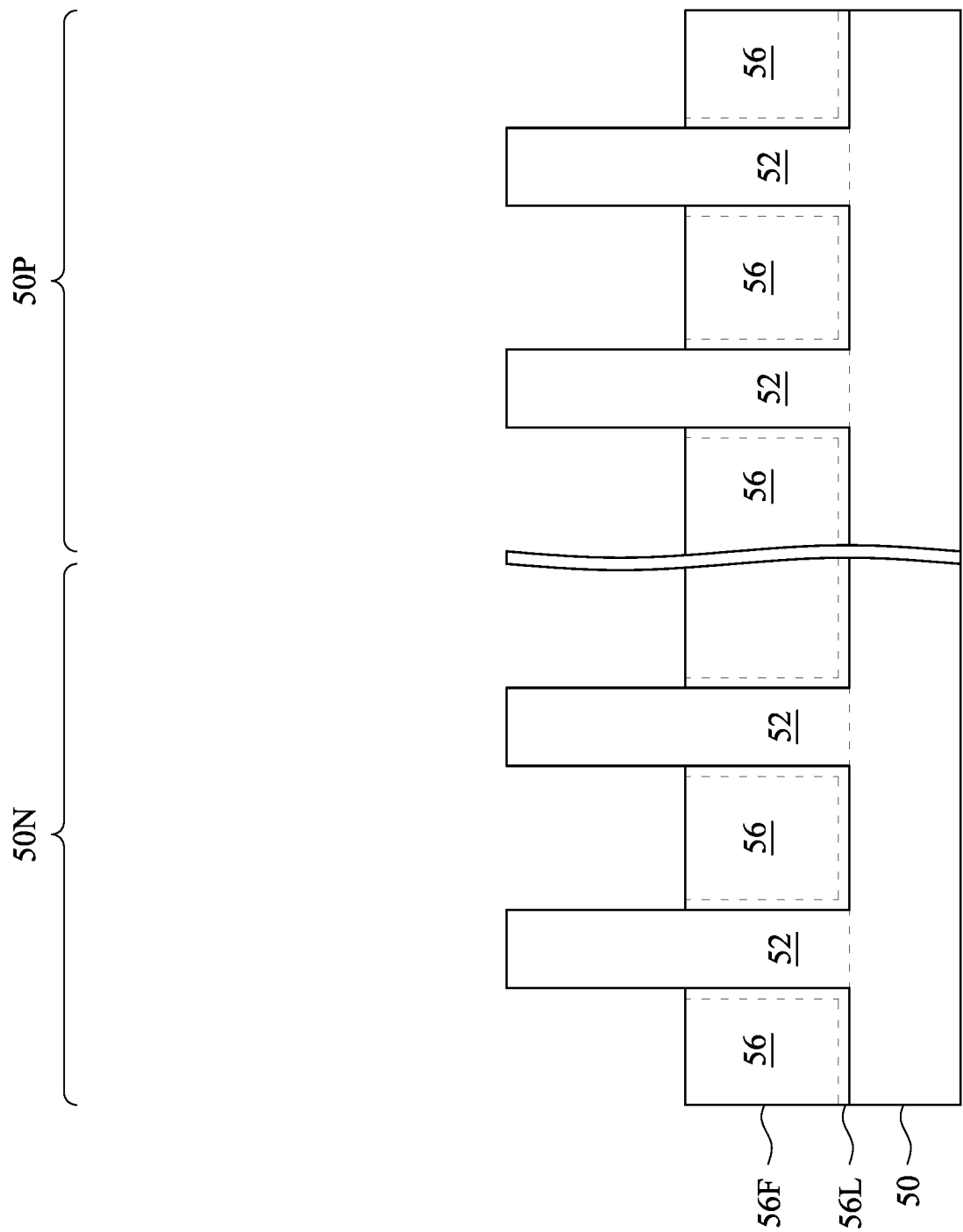

In FIG. 3, STI regions 56 are formed over the substrate 50 and between adjacent fins 52. After the STI regions 56 are formed, the fins 52 protrude above and from between adjacent STI regions 56. In other words, the fins 52 extend above the top surfaces of the STI regions 56. The STI regions 56 separate the features of adjacent devices.

The STI regions 56 may be formed by any suitable method. For example, an insulation material can be formed over the substrate 50 and between adjacent fins 52. The insulation material may be an oxide, such as silicon oxide, a nitride, such as silicon nitride, the like, or a combination thereof, which may be formed by a chemical vapor deposition (CVD) process, such as high-density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the fins 52. Although the STI regions 56 are each illustrated as a single layer, some embodiments may utilize multiple layers. For example, in some embodiments, one or more liner(s) 56L may first be formed along surfaces of the substrate 50 and the fins 52. Thereafter, a fill material 56F may be formed on the liner(s) 56L. The fill material 56F may be formed of insulation material, such as those previously described.

A removal process is then applied to the insulation material to remove excess insulation material over the fins 52. In some embodiments, a planarization process such as a chemical mechanical polish (CMP), an etch-back process, combinations thereof, or the like may be utilized. In embodiments in which a mask remains on the fins 52, the planarization process may expose the mask or remove the mask. After the planarization process, the top surfaces of the insulation material and the mask (if present) or the fins 52 are coplanar (within process variations). Accordingly, the top surfaces of the mask (if present) or the fins 52 are exposed through the insulation material. In the illustrated embodiment, no mask remains on the fins 52. The insulation material is then recessed to form the STI regions 56. The insulation material is recessed such that at least a portion of the fins 52 protrude from between adjacent portions of the insulation material. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The insulation material may be recessed using any acceptable etch process, such as one that is selective to the material of the insulation material (e.g., selectively etches the insulation material of the STI regions 56 at a faster rate than the material of the fins 52). For example, an oxide removal may be performed using dilute hydrofluoric (dHF) acid.

The process previously described is just one example of how the fins 52 and the STI regions 56 may be formed. In some embodiments, the fins 52 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 52. In some embodiments where epitaxial structures are epitaxially grown, the epitaxially grown materials may be in situ doped during growth, which may obviate prior and/or subsequent implantations, although in situ and implantation doping may be used together.

Further, it may be advantageous to epitaxially grow a material in the n-type region 50N different from the material in the p-type region 50P. In various embodiments, upper portions of the fins 52 may be formed of silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not separately illustrated) may be formed in the fins 52 and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the fins 52 and the STI regions 56 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{16}$ $cm^{-3}$ to $10^{18}$ $cm^{-3}$. After the implant, the photoresist is removed, such as by any acceptable ashing process.

Following or prior to the implanting of the p-type region 50P, a mask (not separately illustrated) such as a photoresist is formed over the fins 52 and the STI regions 56 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{16}$ $cm^{-3}$ to $10^{18}$ $cm^{-3}$. After the implant, the photoresist is removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 52, the grown materials may be in situ doped during growth, which may obviate the implantations, although in situ and implantation doping may be used together.

Figure 4:
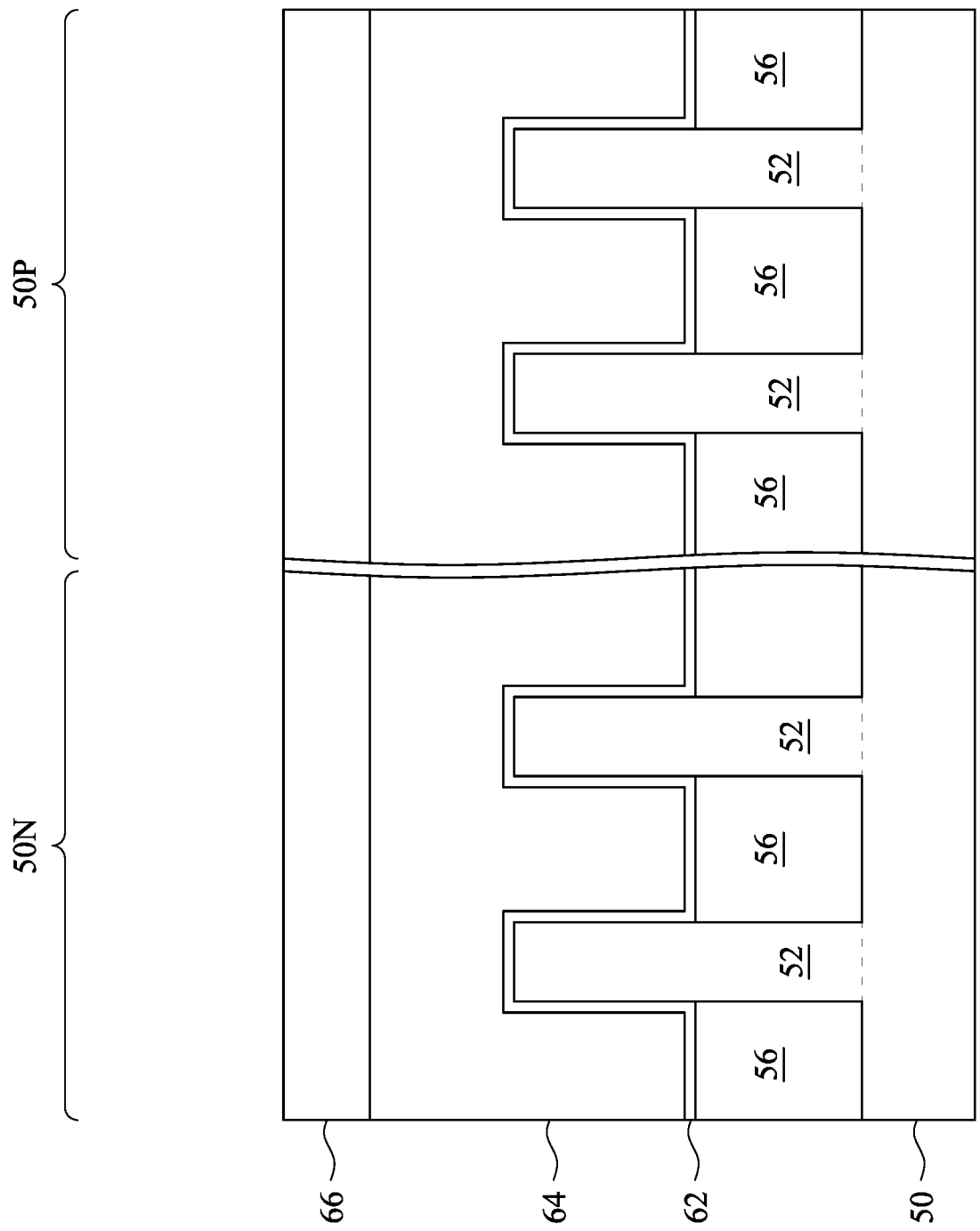

In FIG. 4, a dummy dielectric layer 62 is formed on the fins 52. The dummy dielectric layer 62 may be formed of a dielectric material such as silicon oxide, silicon nitride, a combination thereof, or the like, which may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 64 may be formed of material(s) that have a high etching selectivity from insulation materials, e.g., the STI regions 56 and/or the dummy dielectric layer 62. The mask layer 66 may be formed of a dielectric material such as silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the fins 52 and the STI regions 56, such that the dummy dielectric layer 62 extends over the STI regions 56 and between the dummy gate layer 64 and the STI regions 56. In another embodiment, the dummy dielectric layer 62 covers only the fins 52.

FIGS. 5A-19B illustrate various additional steps in the manufacturing of embodiment devices. FIGS. 5A-19B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure.

Further, FIGS. 5A-19B illustrate features in a sparse region 50S and a dense region 50D. The gates structures in the sparse region 50S have channel regions with long lengths, which may be desirable for some types of devices, such as devices that operate at high power. The gates structures in the dense region 50D have channel regions with short lengths, which may be desirable for some types of devices, such as devices that operate at high speeds. More generally, the channel regions of the devices in the sparse region 50S are longer than the channel regions of the devices in the dense region 50D. The lengths of the channel regions are measured in a direction parallel to the longitudinal axes of the fins 52. In some embodiments, the sparse region 50S is an input/output region and the dense region 50D is a core logic region. Each of the regions 50S, 50D can include devices from both of the regions 50N, 50P. In other words, the sparse region 50S and the dense region 50D can each include n-type devices and p-type devices.

Figure 5A:
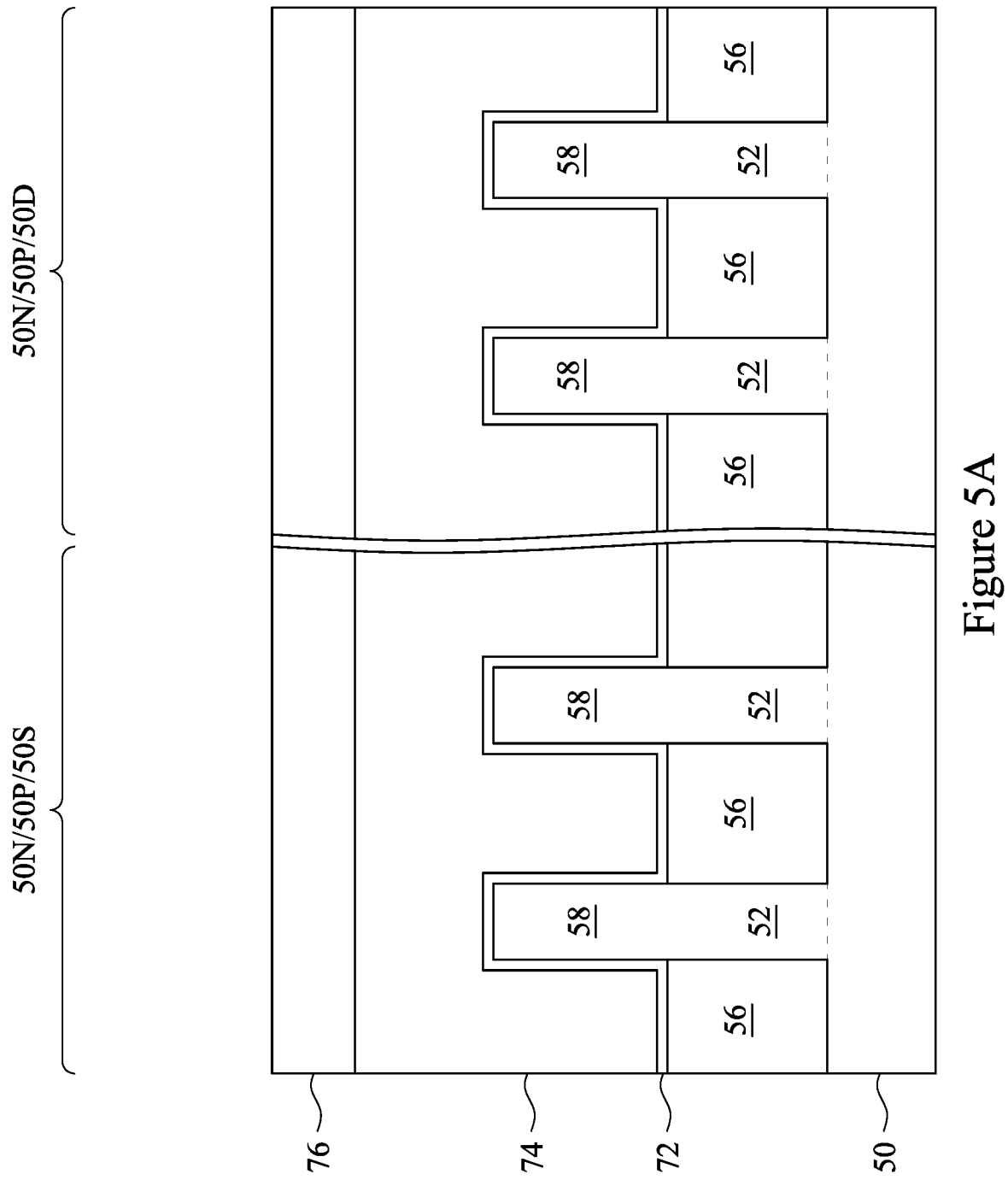
Figure 5B:
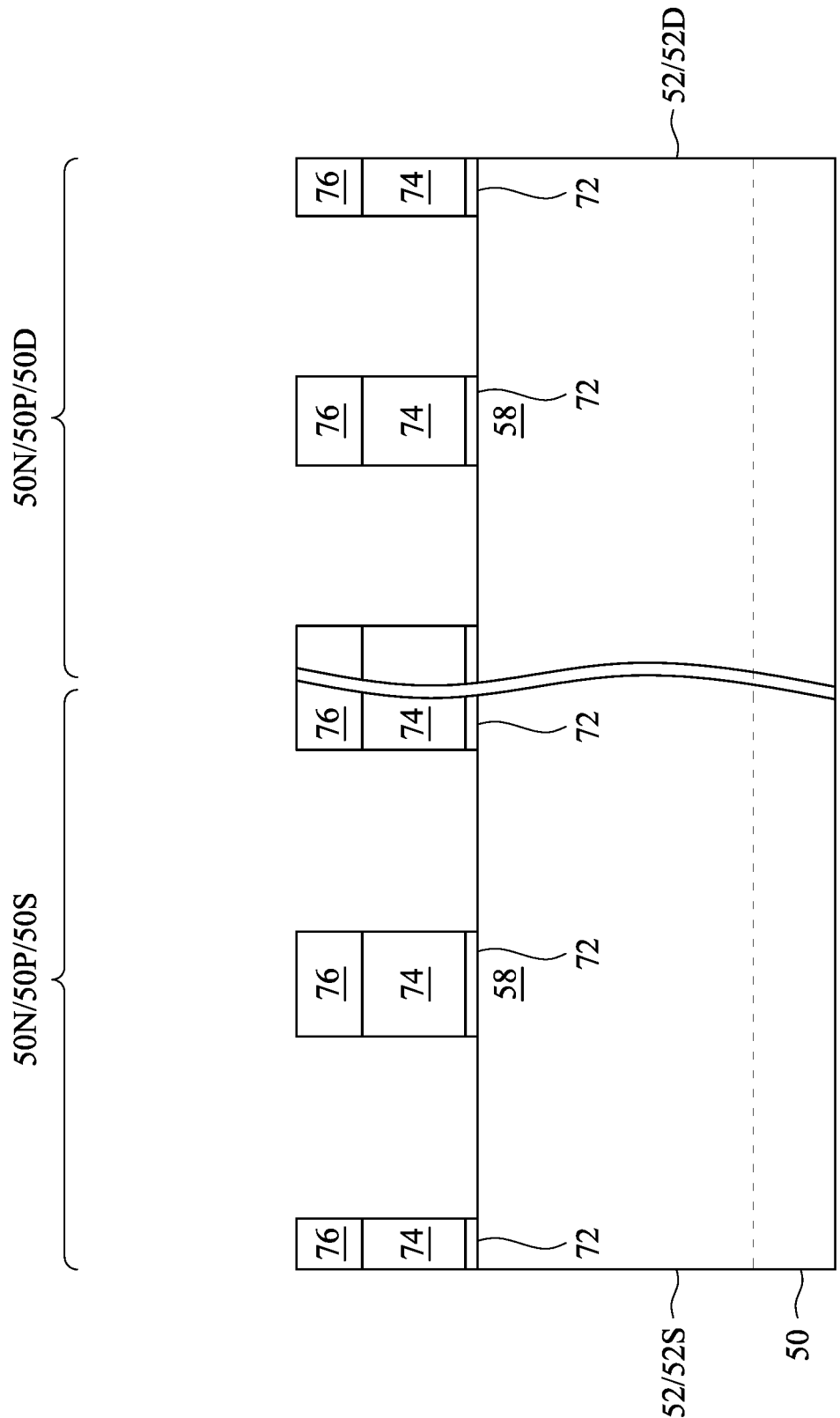

In FIGS. 5A-5B, the mask layer 66 is patterned using acceptable photolithography and etching techniques to form masks 76. The pattern of the masks 76 is then transferred to the dummy gate layer 64 by any acceptable etching technique to form dummy gates 74. The pattern of the masks 76 may optionally be further transferred to the dummy dielectric layer 62 by any acceptable etching technique to form dummy dielectrics 72. The dummy gates 74 cover respective channel regions 58 of the fins 52. The pattern of the masks 76 may be used to physically separate adjacent dummy gates 74. The dummy gates 74 may also have lengthwise directions substantially perpendicular (within process variations) to the lengthwise directions of the fins 52. The masks 76 may be removed during the patterning of the dummy gate 74, or may be removed during subsequent processing.

The dummy dielectrics 72 will subsequently be used as etch stop layers, and will be removed during a gate replacement process after they are used as etch stop layers. Advantageously, the dummy dielectrics 72 are formed thinner than other types of dummy dielectrics, such as dummy dielectrics that are used as interfacial layers in subsequently formed replacement gates of the resulting FinFETs. In some embodiments, the dummy dielectrics 72 and the dummy dielectric layer 62 have a thickness in the range of 1.5 nm to 4 nm.

Figure 6A:
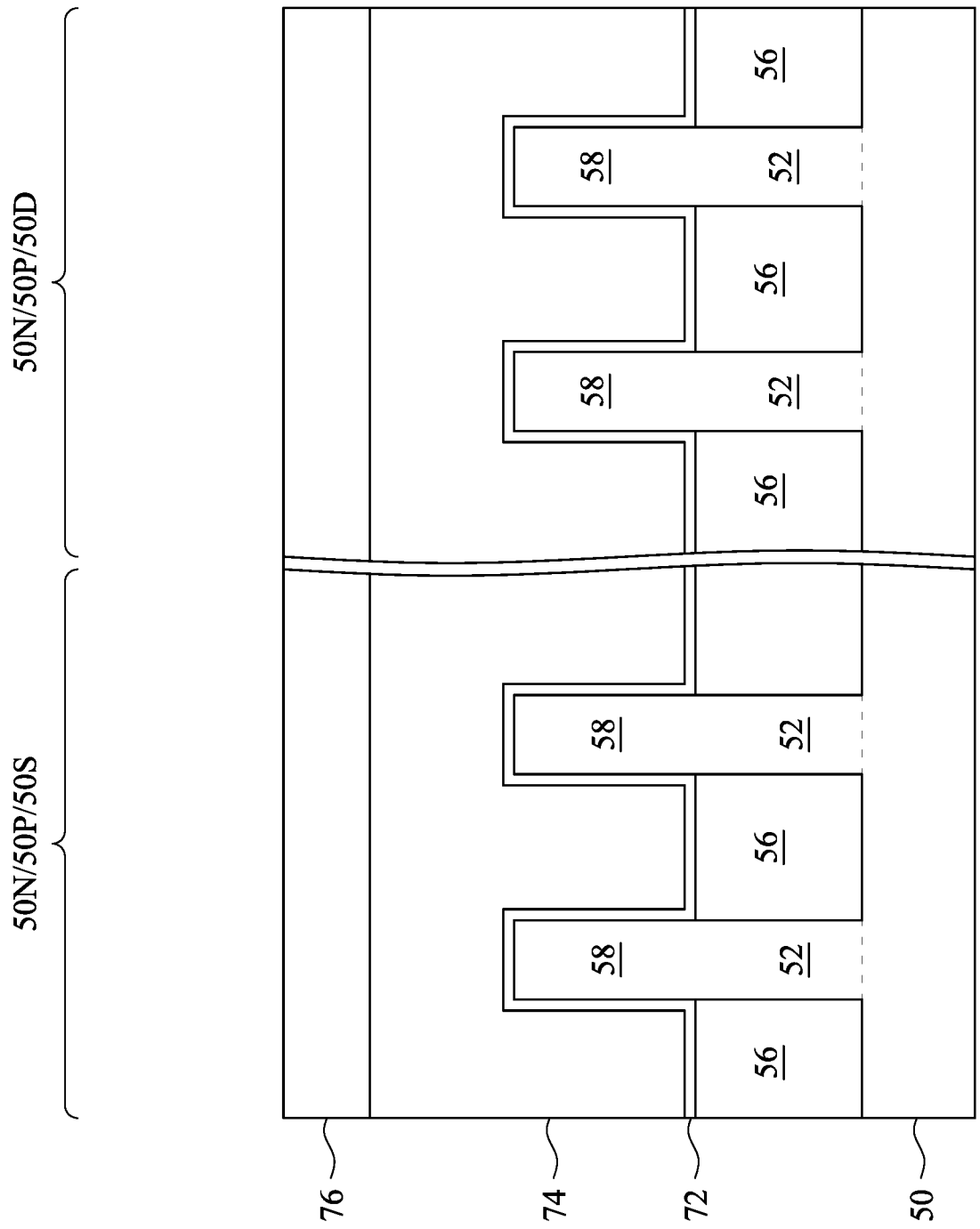
Figure 6B:
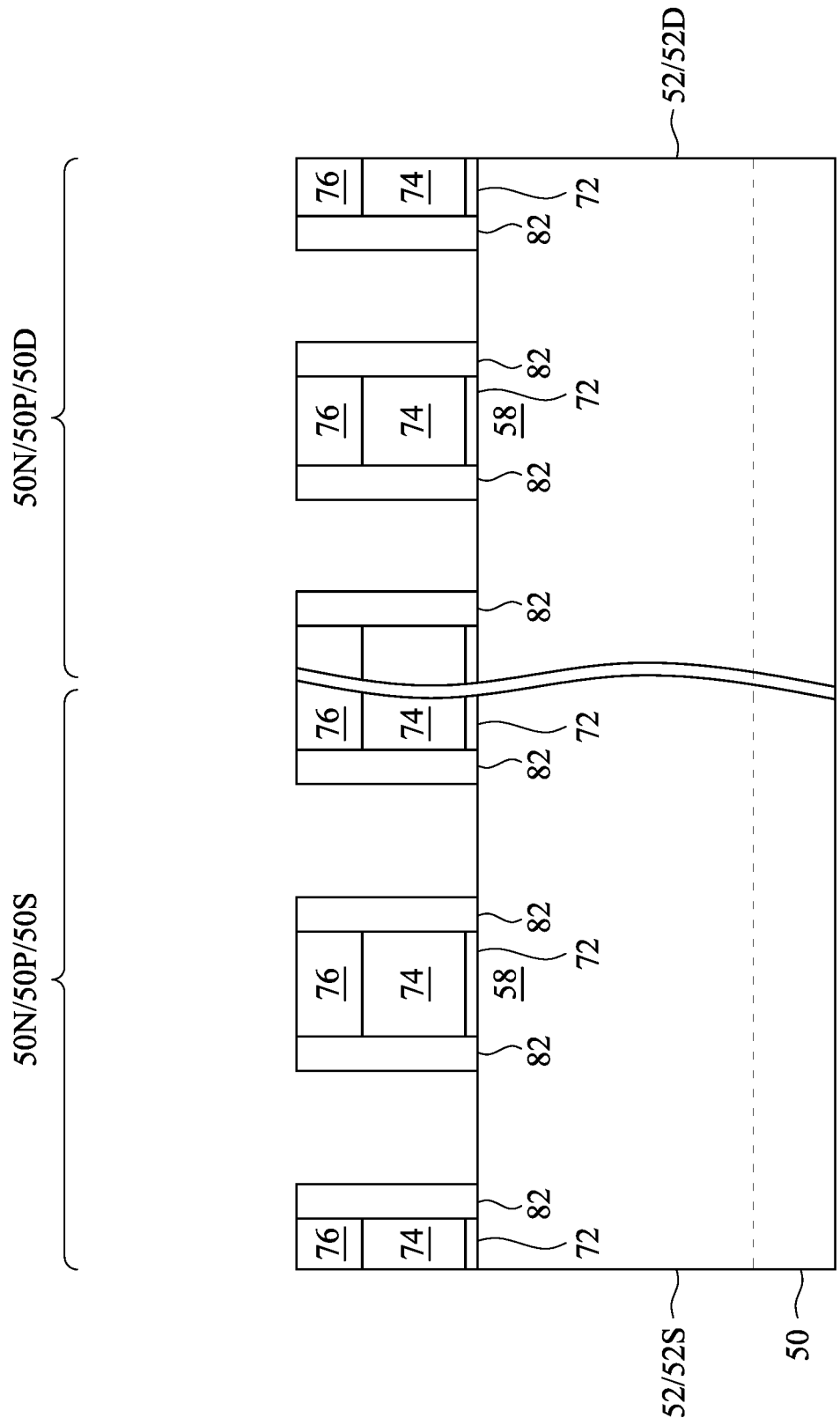

In FIGS. 6A-6B, gate spacers 82 are formed over the fins 52, on exposed sidewalls of the masks 76 (if present), the dummy gates 74, and the dummy dielectrics 72. The gate spacers 82 may be formed by conformally depositing one or more dielectric material(s) and subsequently etching the dielectric material(s). Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 74 (thus forming the gate spacers 82, see FIG. 6B). As will be subsequently described in greater detail, in some embodiments the etch used to form the gate spacers 82 is adjusted so that the dielectric material(s), when etched, also have portions left on the sidewalls of the fins 52 (thus forming fin spacers 84, see FIGS. 7C and 7D). After etching, the fin spacers 84 (if present) and the gate spacers 82 can have straight sidewalls (as illustrated) or can have rounded sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 52 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 52 exposed in the n-type region 50N. The mask may then be removed. The n-type impurities may be any of the n-type impurities previously described, and the p-type impurities may be any of the p-type impurities previously described. During the implanting, the channel regions 58 remain covered by the dummy gates 74, so that the channel regions 58 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized, spacers may be formed and removed, and/or the like. Furthermore, the n-type and p-type devices may be formed using a different structures and steps.

Figure 7A:
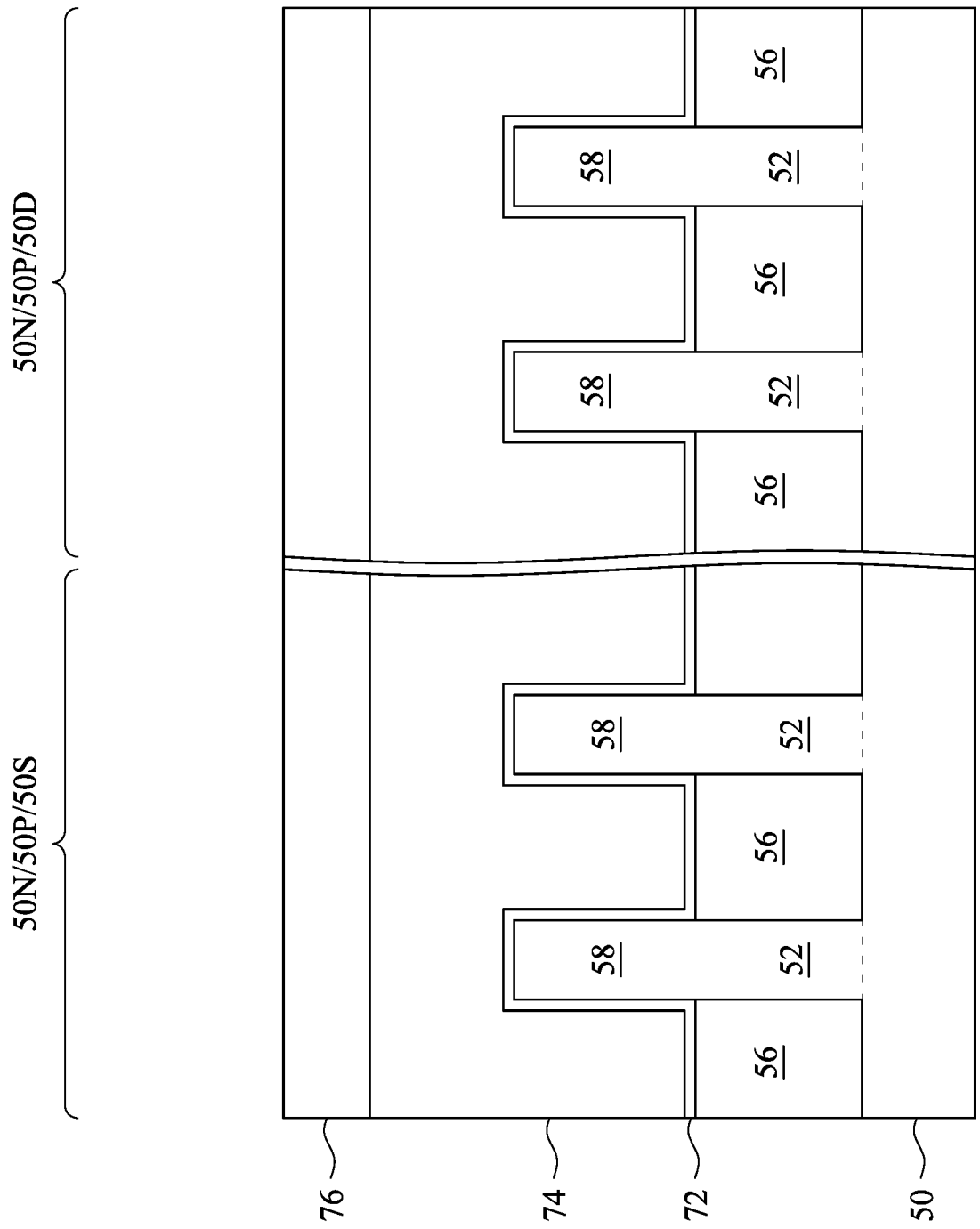
Figure 7B:
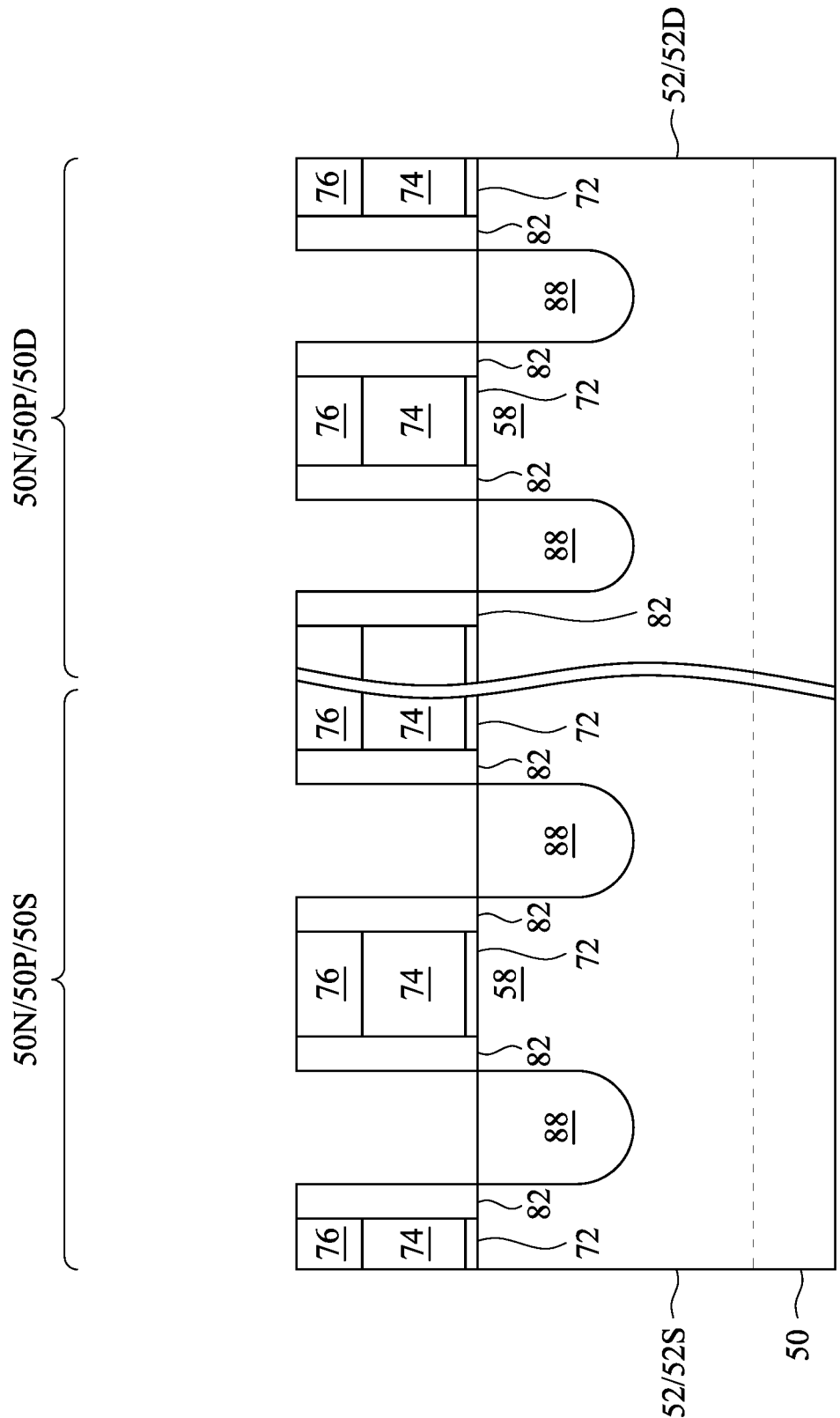
Figure 7D:
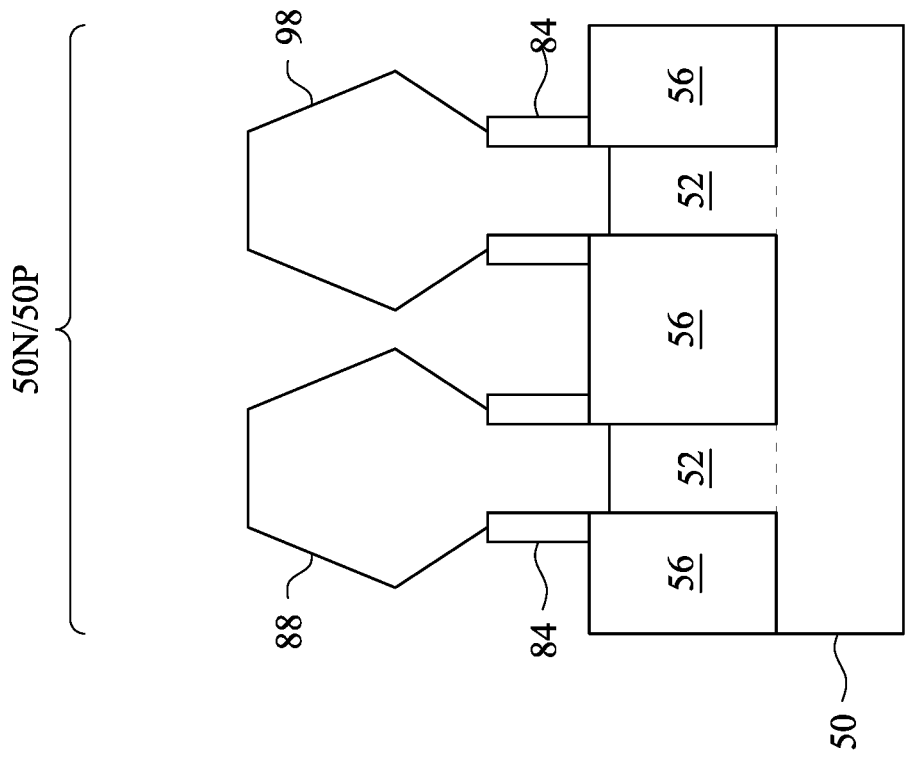
Figure 7C:
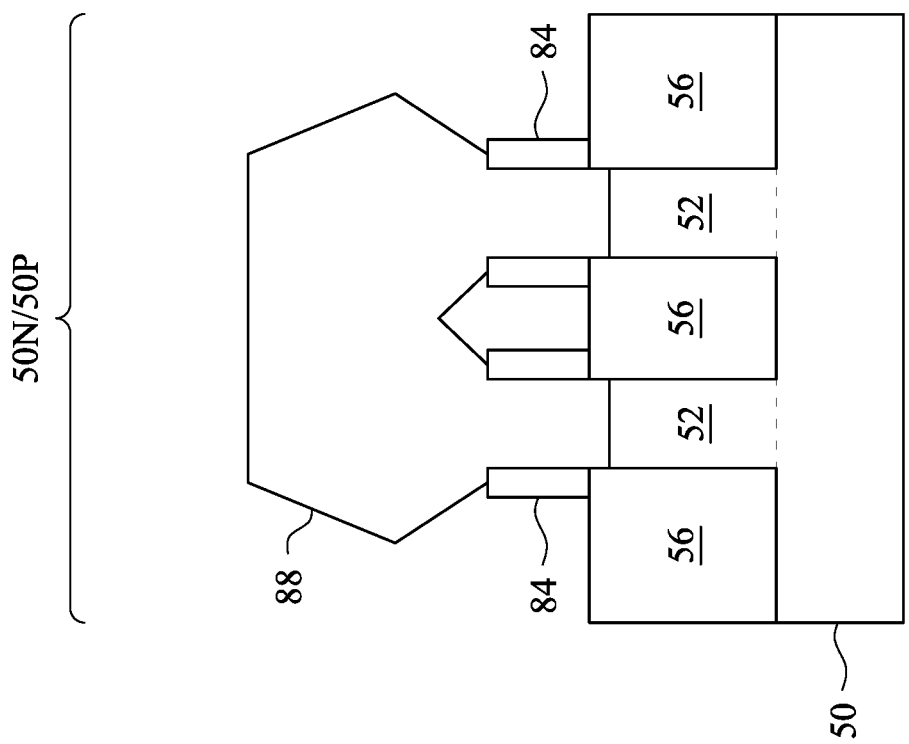

In FIGS. 7A-7B, epitaxial source/drain regions 88 are formed in the fins 52. The epitaxial source/drain regions 88 are formed in the fins 52 such that each dummy gate 74 is disposed between respective neighboring pairs of the epitaxial source/drain regions 88. In some embodiments the epitaxial source/drain regions 88 may extend into, and may also penetrate through, the fins 52. In some embodiments, the gate spacers 82 are used to separate the epitaxial source/drain regions 88 from the dummy gates 74 by an appropriate lateral distance so that the epitaxial source/drain regions 88 do not short out subsequently formed gates of the resulting FinFETs. A material of the epitaxial source/drain regions 88 may be selected to exert stress in the respective channel regions 58, thereby improving performance.

The epitaxial source/drain regions 88 in the n-type region 50N may be formed by masking the p-type region 50P and etching source/drain regions of the fins 52 in the n-type region 50N to form recesses in the fins 52. Then, the epitaxial source/drain regions 88 in the n-type region 50N are epitaxially grown in the recesses. The epitaxial source/drain regions 88 may include any acceptable material, such as appropriate for n-type FinFETs. For example, if the fins 52 in the n-type region 50N are silicon, the epitaxial source/drain regions 88 in the n-type region 50N may include materials exerting a tensile strain in the channel regions 58, such as silicon, silicon carbide, phosphorous doped silicon carbide, silicon phosphide, or the like. The epitaxial source/drain regions 88 in the n-type region 50N may have surfaces raised from respective surfaces of the fins 52 and may have facets.

The epitaxial source/drain regions 88 in the p-type region 50P may be formed by masking the n-type region 50N and etching source/drain regions of the fins 52 in the p-type region 50P to form recesses in the fins 52. Then, the epitaxial source/drain regions 88 in the p-type region 50P are epitaxially grown in the recesses. The epitaxial source/drain regions 88 may include any acceptable material, such as appropriate for p-type FinFETs. For example, if the fins 52 in the p-type region 50P are silicon, the epitaxial source/drain regions 88 in the p-type region 50P may comprise materials exerting a compressive strain in the channel regions 58, such as silicon-germanium, boron doped silicon-germanium, germanium, germanium tin, or the like. The epitaxial source/drain regions 88 in the p-type region 50P may have surfaces raised from respective surfaces of the fins 52 and may have facets.

The epitaxial source/drain regions 88 and/or the fins 52 may be implanted with dopants to form source/drain regions, similar to the process previously discussed for forming lightly-doped source/drain regions, followed by an anneal. The source/drain regions may have an impurity concentration of between $10^{19}$ cm$^{-3}$ and $10^{21}$ cm$^{-3}$. The n-type and/or p-type impurities for source/drain regions may be any of the impurities previously discussed. In some embodiments, the epitaxial source/drain regions 88 may be in situ doped during growth.

As a result of the epitaxy processes used to form the epitaxial source/drain regions 88, upper surfaces of the epitaxial source/drain regions have facets which expand laterally outward beyond sidewalls of the fins 52. In some embodiments, these facets cause adjacent epitaxial source/drain regions 88 to merge as illustrated by FIG. 7C. In some embodiments, adjacent epitaxial source/drain regions 88 remain separated after the epitaxy process is completed as illustrated by FIG. 7D. In the illustrated embodiments, fin spacers 84 are formed to cover a portion of the sidewalls of the fins 52 that extend above the STI regions 56, thereby blocking the epitaxial growth. In another embodiment, the spacer etch used to form the gate spacers 82 is adjusted to not form the fin spacers 84, so as to allow the epitaxial source/drain regions 88 to extend to the surface of the STI regions 56.

Figure 8A:
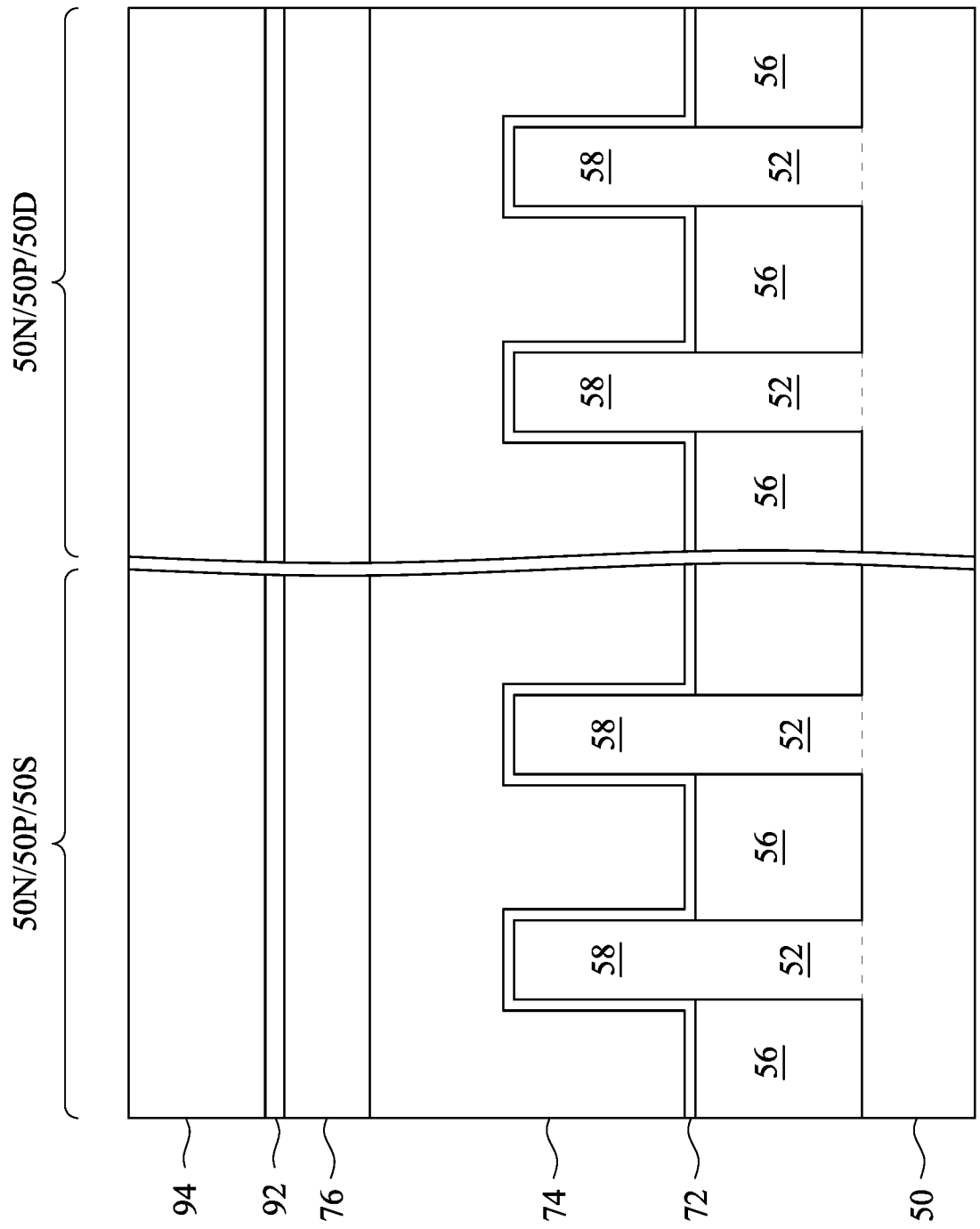
Figure 8B:
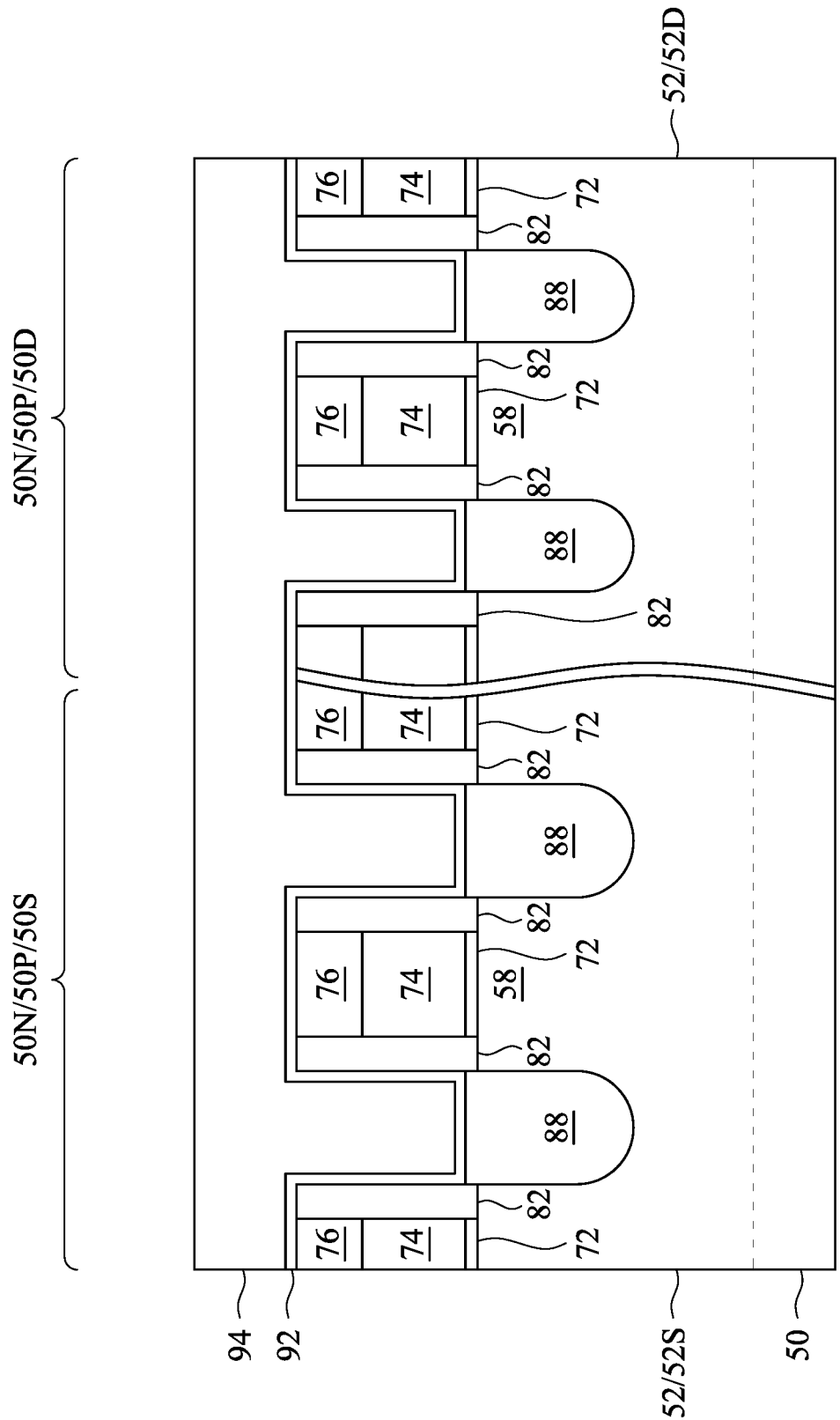

In FIGS. 8A-8B, a first ILD 94 is deposited over the epitaxial source/drain regions 88, the gate spacers 82, and the masks 76 (if present) or the dummy gates 74. The first ILD 94 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 92 is formed between the first ILD 94 and the epitaxial source/drain regions 88, the gate spacers 82, and the masks 76 (if present) or the dummy gates 74. The CESL 92 may be formed of a dielectric material having a high etching selectivity from the first ILD 94. Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like.

Figure 9A:
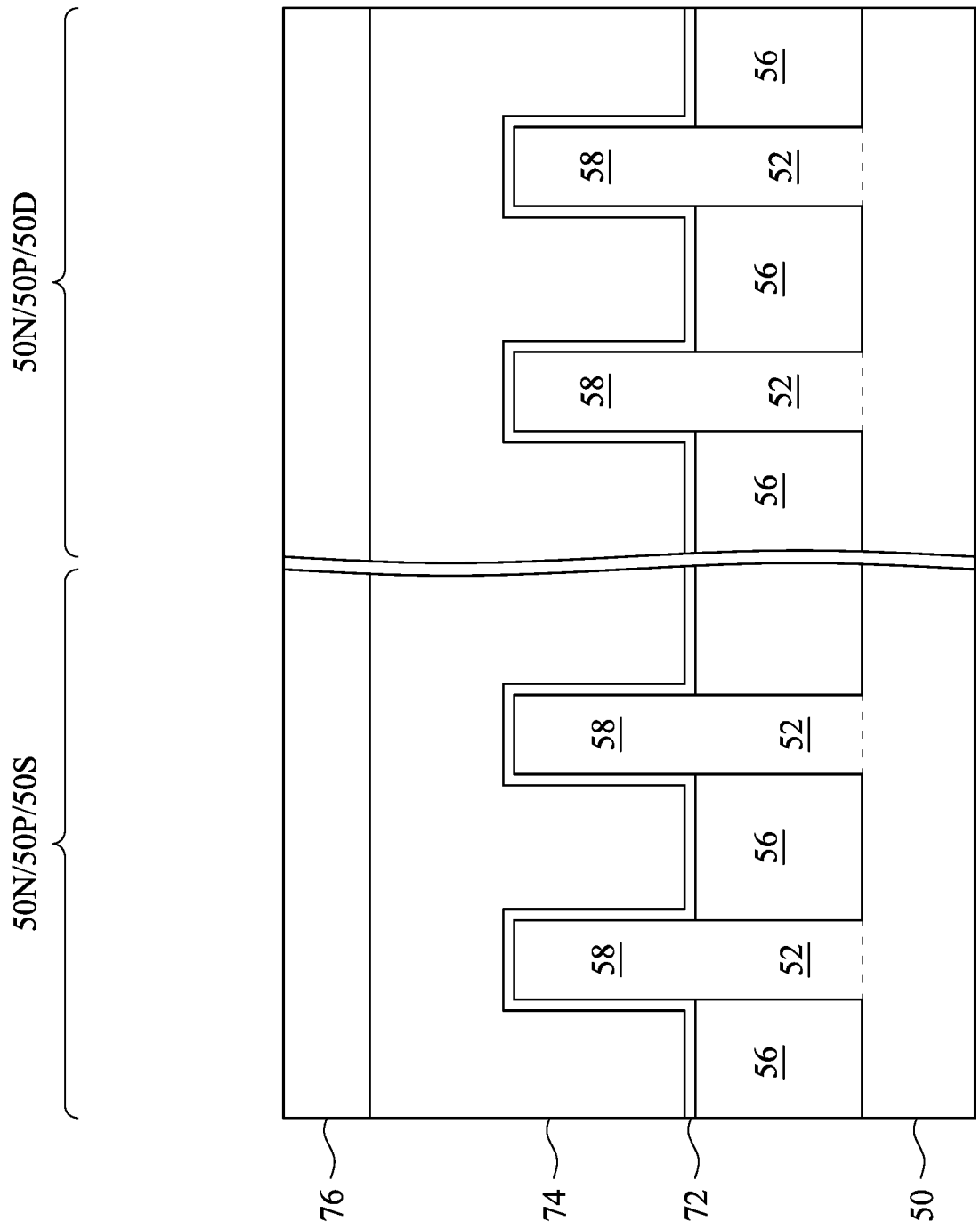
Figure 9B:
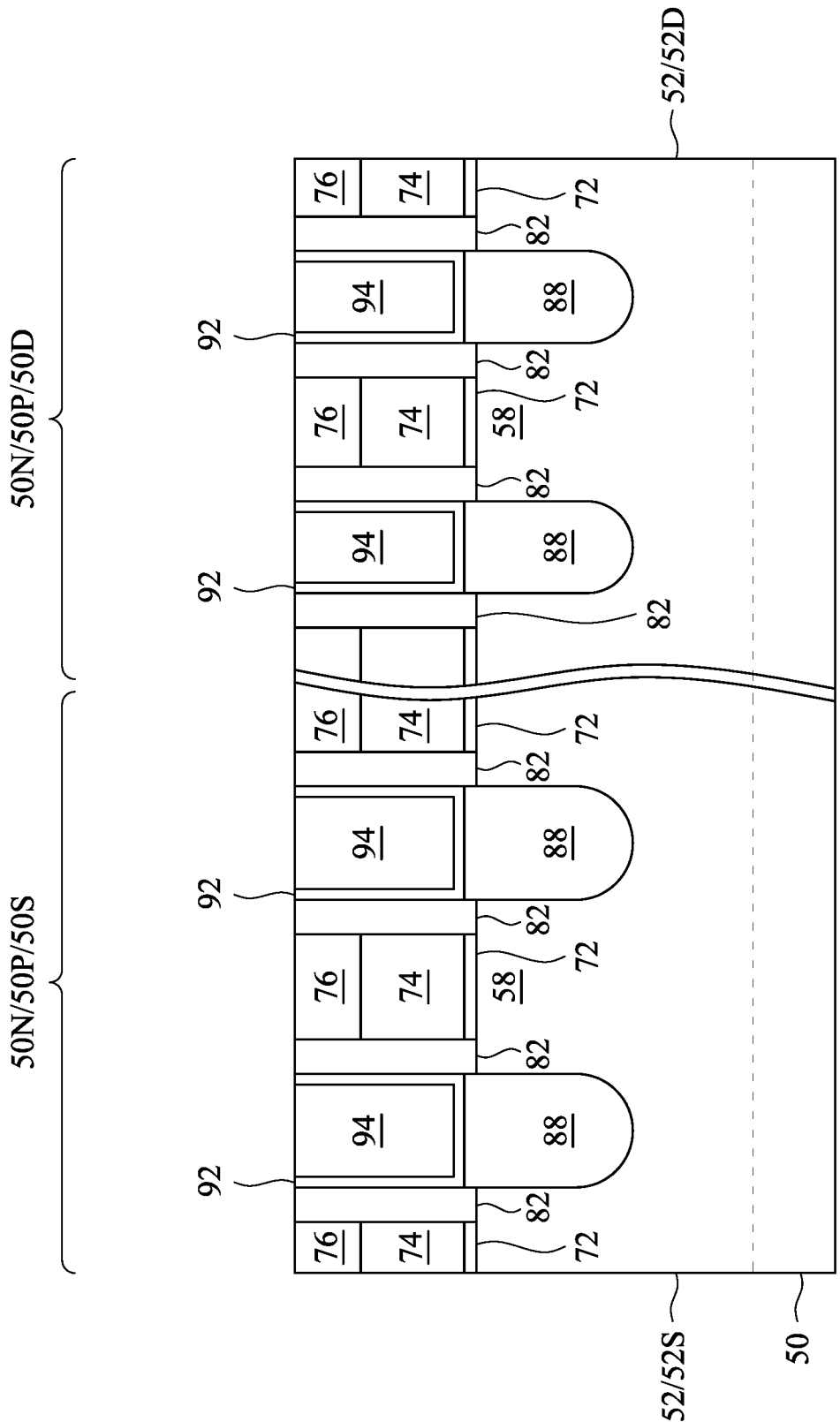

In FIGS. 9A-9B, a removal process is performed to level the top surfaces of the first ILD 94 with the top surfaces of the masks 76 (if present) or the dummy gates 74. In some embodiments, a planarization process such as a chemical mechanical polish (CMP), an etch-back process, combinations thereof, or the like may be utilized. The planarization process may also remove the masks 76 on the dummy gates 74, and portions of the gate spacers 82 along sidewalls of the masks 76. After the planarization process, the top surfaces of the first ILD 94, the CESL 92, the gate spacers 82, and the masks 76 (if present) or the dummy gates 74 are substantially coplanar (within process variations). Accordingly, the top surfaces of the masks 76 (if present) or the dummy gates 74 are exposed through the first ILD 94. In the illustrated embodiment, the masks 76 remain, and the planarization process levels the top surfaces of the first ILD 94 with the top surfaces of the masks 76.

As will be subsequently described in greater detail, FIGS. 10A-16B illustrate a gate replacement process in which the dummy gates 74 and the dummy dielectrics 72 are replaced with gate structures for the resulting FinFETs. During the gate replacement process, the dummy dielectrics 72 are used as etch stop layers when removing the dummy gates 74, and the dummy dielectrics 72 are then removed. Specifically, the dummy dielectrics 72 are removed from both the sparse region 50S and the dense region 50D of the substrate 50, and are not used as interfacial layers for subsequently formed high-k gate dielectrics in either region. A replacement interfacial layer is formed during the gate replacement process. Forming a replacement interfacial layer instead of utilizing the dummy dielectrics 72 as interfacial layers may be advantageous. Specifically, the dummy dielectrics 72 maybe damaged by some of the previously described processing steps (e.g., implanting steps, epitaxial growth steps, etching steps, etc.), and replacing the dummy dielectrics 72 with a higher quality interfacial layer may improve device performance. Additionally, patterning of the dummy dielectrics 72 during the gate replacement process may be avoided, reducing manufacturing complexity (such as by avoiding additional photoresist patterning and stripping steps). Further, the dummy dielectrics 72 may be formed thinner than other types of dummy dielectrics, such as dummy dielectrics that are used as interfacial layers, allowing for a reduction in etching losses when removing the dummy dielectrics 72.

According to various embodiments, an interfacial layer 106 (described for FIGS. 11A-11B) for a gate dielectric layer 102 is initially formed in both the sparse region 50S and the dense region 50D such that the thickness of the interfacial layer 106 is substantially uniform (within process variations) in the sparse region 50S and the dense region 50D. The thickness of the portions of the interfacial layer 106S on the channel regions 58S in the sparse region 50S is then increased (described for FIGS. 12A-14B), while the thickness of the portions of the interfacial layer 106D on the channel regions 58D in the dense region 50D is substantially unchanged. Increasing the thickness of the portions of the interfacial layer 106S on the channel regions 58S can reduce the leakage current of the devices in the sparse region 50S, which may be advantageous when the devices in the sparse region 50S are devices that operate at a high voltage, such as input/output devices. A gate electrode layer 104 is formed on the gate dielectric layer 102.

Figure 10A:
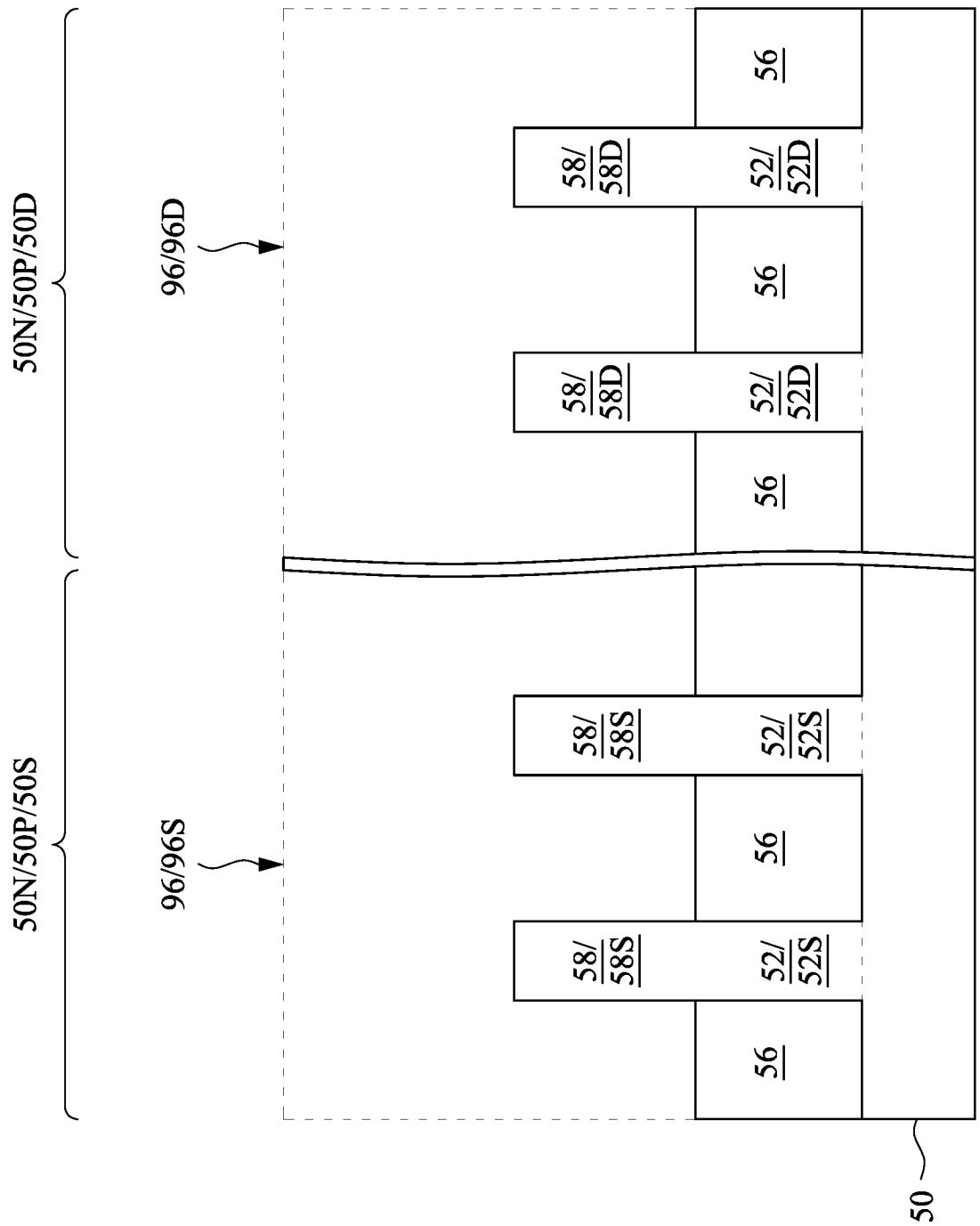
Figure 10B:
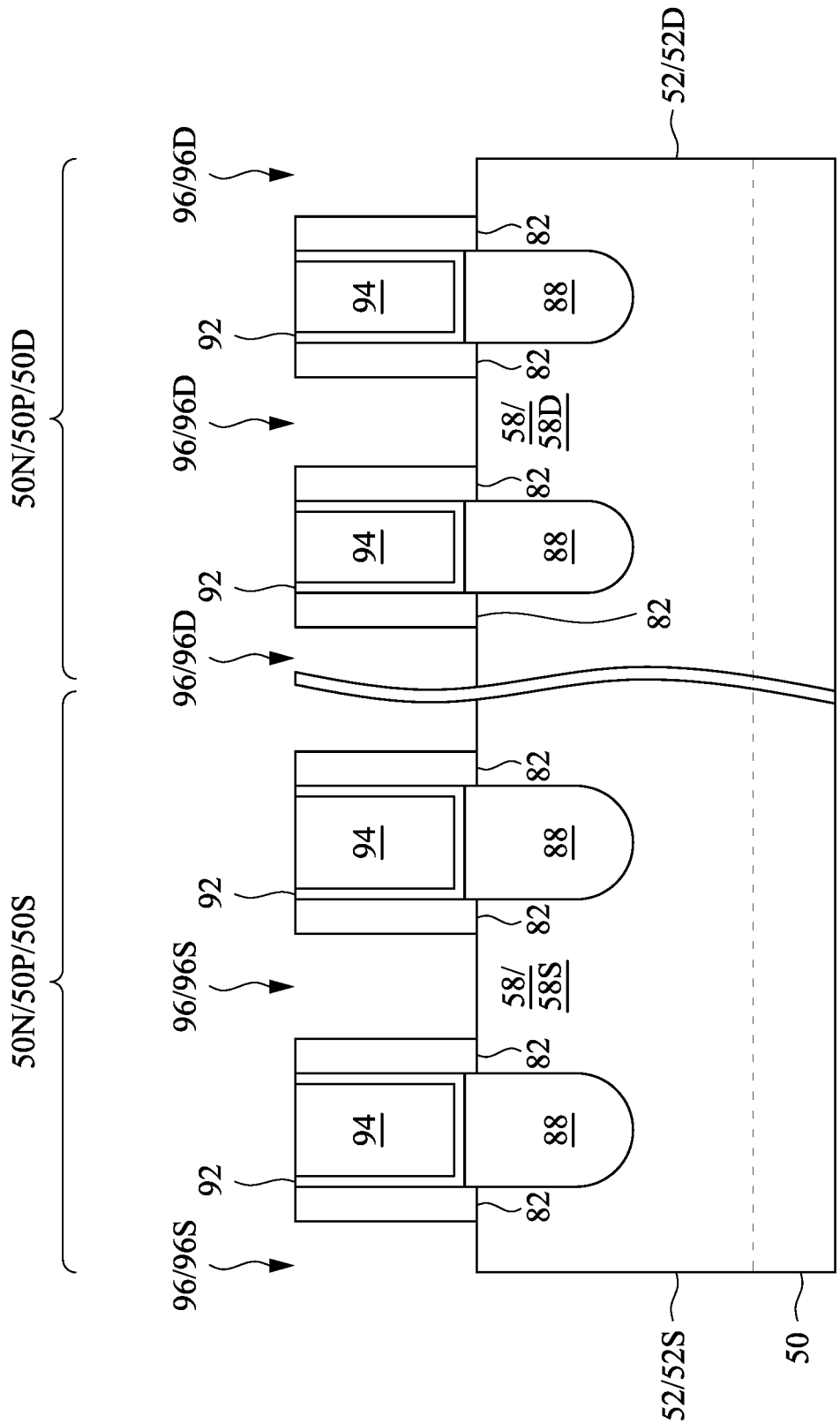

In FIGS. 10A-10B, the masks 76 (if present) and the dummy gates 74 are removed in an etching process, so that recesses 96 are formed. Portions of the dummy dielectrics 72 in the recesses 96 are then removed. In some embodiments, the dummy gates 74 are removed by an anisotropic dry etch process. For example, the etching process may include a dry etch process using reaction gas(es) that selectively etch the dummy gates 74 at a faster rate than the first ILD 94, the gate spacers 82, and the dummy dielectrics 72. During the removal, the dummy dielectrics 72 are used as etch stop layers when the dummy gates 74 are etched. The dummy dielectrics 72 are then removed after the removal of the dummy gates 74. The dummy dielectrics 72 are removed from the recesses 96 in both the sparse region 50S and the dense region 50D. Each recess 96 exposes a channel region 58 of a respective fin 52. The recesses 96S in the sparse region 50S are wider than the recesses 96D in the dense region 50D. The widths of the recesses 96S, 96D are measured in a direction parallel to the longitudinal axes of the fins 52.

The dummy dielectrics 72 are removed from both the sparse region 50S and the dense region 50D, and do not remain in any regions of the substrate 50 after removal. As noted above, the dummy dielectrics 72 are formed thinner than other types of dummy dielectrics, such as dummy dielectrics that are used as interfacial layers in subsequently formed replacement gates of the resulting FinFETs. As such, the dummy dielectrics 72 may be removed with a small amount of etching, e.g., an etch performed for a brief duration. The processing window for the gate replacement process may thus be improved. In some embodiments, the dummy dielectrics 72 are removed with a wet etch performed using dilute hydrofluoric (dHF) acid for a duration in the range 10 seconds to 200 seconds. In some embodiments, the dummy dielectrics 72 are removed with a dry etch performed using a mixture of dilute hydrofluoric (dHF) acid and ammonia ($NH_3$). Removing the dummy dielectrics 72 with a small amount of etching may reduce damage to and/or losses of the gate spacers 82, thereby reducing the gate-drain capacitance ($C_{gd}$) of the resulting FinFETs and reducing leakage between the epitaxial source/drain regions 88 and the subsequently formed replacement gates.

Figure 11A:
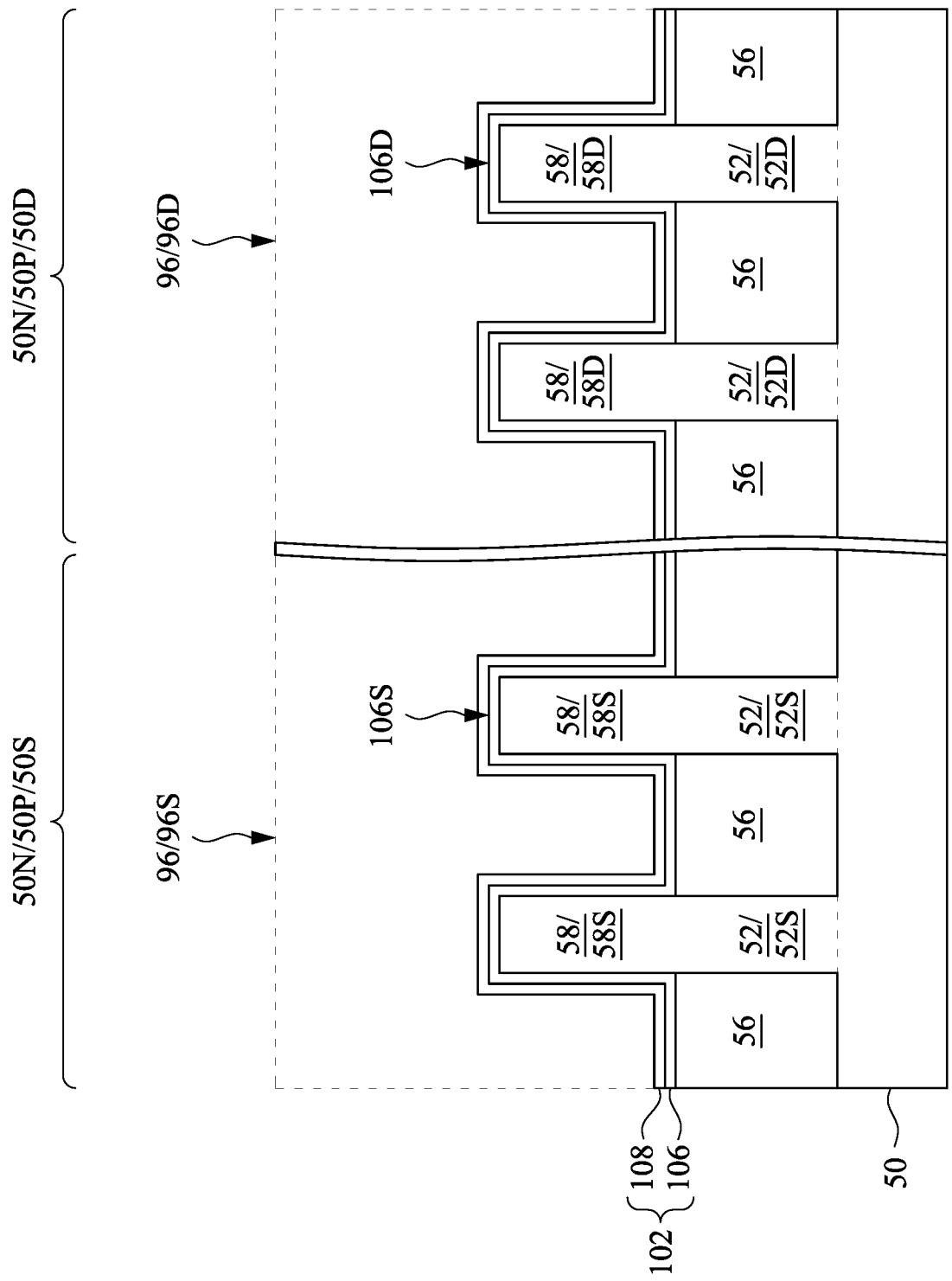
Figure 11B:
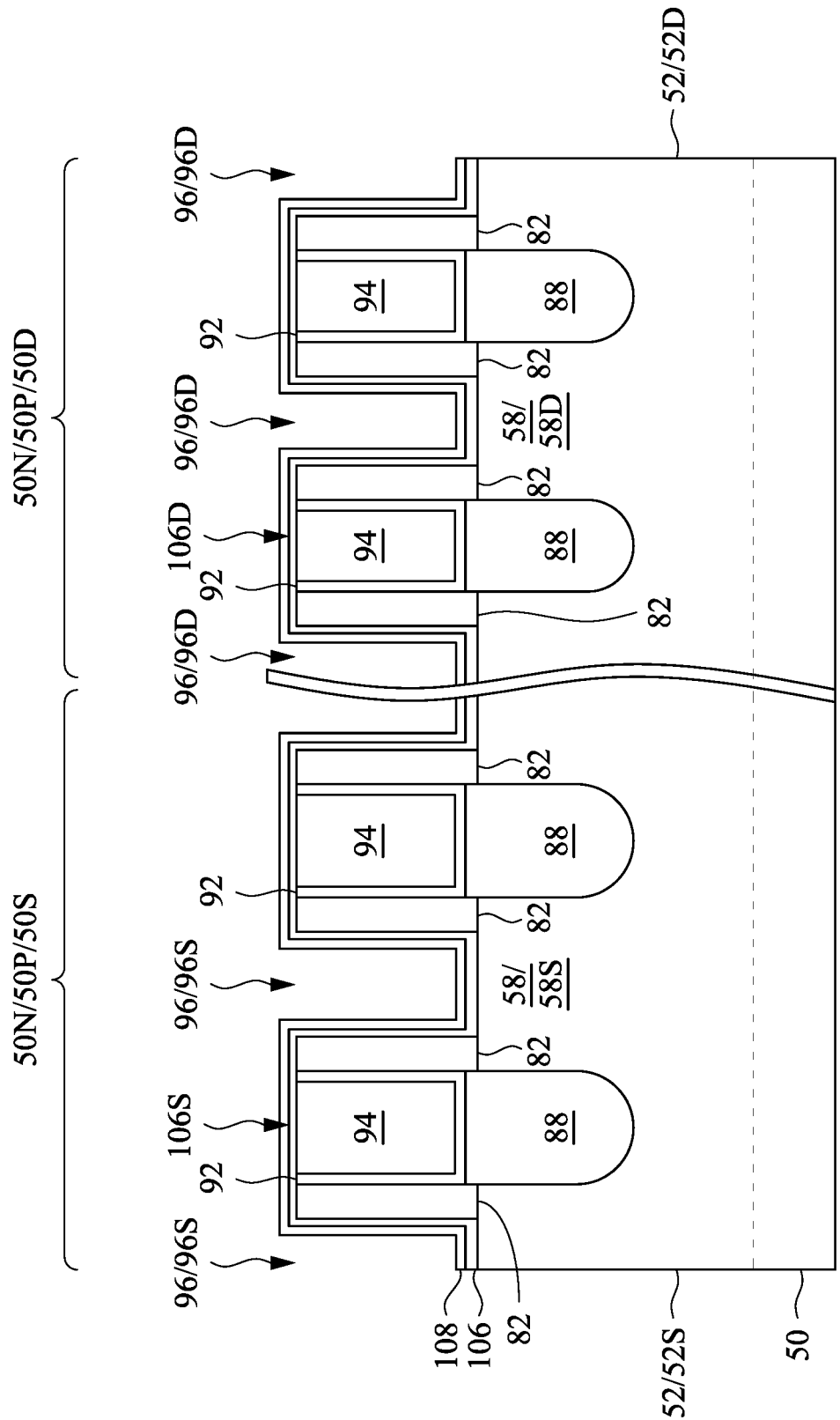

In FIGS. 11A-11B, a gate dielectric layer 102 is formed in the recesses 96. The gate dielectric layer 102 extends along sidewalls and over top surfaces of the channel regions 58. The gate dielectric layer 102 is disposed on the sidewalls and/or the top surfaces of the fins 52 and on the sidewalls of the gate spacers 82. The gate dielectric layer 102 may also be formed on the top surfaces of the first ILD 94 and the gate spacers 82. The gate dielectric layer 102 includes an interfacial layer 106 and an overlying high-k dielectric layer 108. The interfacial layer 106 is formed of a low-k dielectric material (e.g., a dielectric material having a k-value less than 3.5) such as an oxide, such as silicon oxide or a metal oxide, a silicate such as a metal silicate, combinations thereof, multi-layers thereof, or the like. The high-k dielectric layer 108 is formed of a high-k dielectric material (e.g., a dielectric material having a k-value greater than 7.0), such as a metal oxide or a silicate of hafnium, aluminum, zirconium, lanthanum, manganese, barium, titanium, lead, and combinations thereof. The formation methods of the gate dielectric layer 102 (including the interfacial layer 106 and the high-k dielectric layer 108) may include molecular-beam deposition (MBD), ALD, PECVD, and the like.

The interfacial layer 106 is initially formed in both the sparse region 50S and the dense region 50D such that the thickness of the interfacial layer 106 is substantially uniform (within process variations) in the sparse region 50S and the dense region 50D. In some embodiments, the interfacial layer 106 has an initial thickness in the range of 0.5 nm to 1.5 nm. The interfacial layer 106 is deposited directly on the channel regions 58 (including the channel regions 58S, 58D), such that no other insulation materials separate the interfacial layer 106 from the channel regions 58.

Figure 12A:
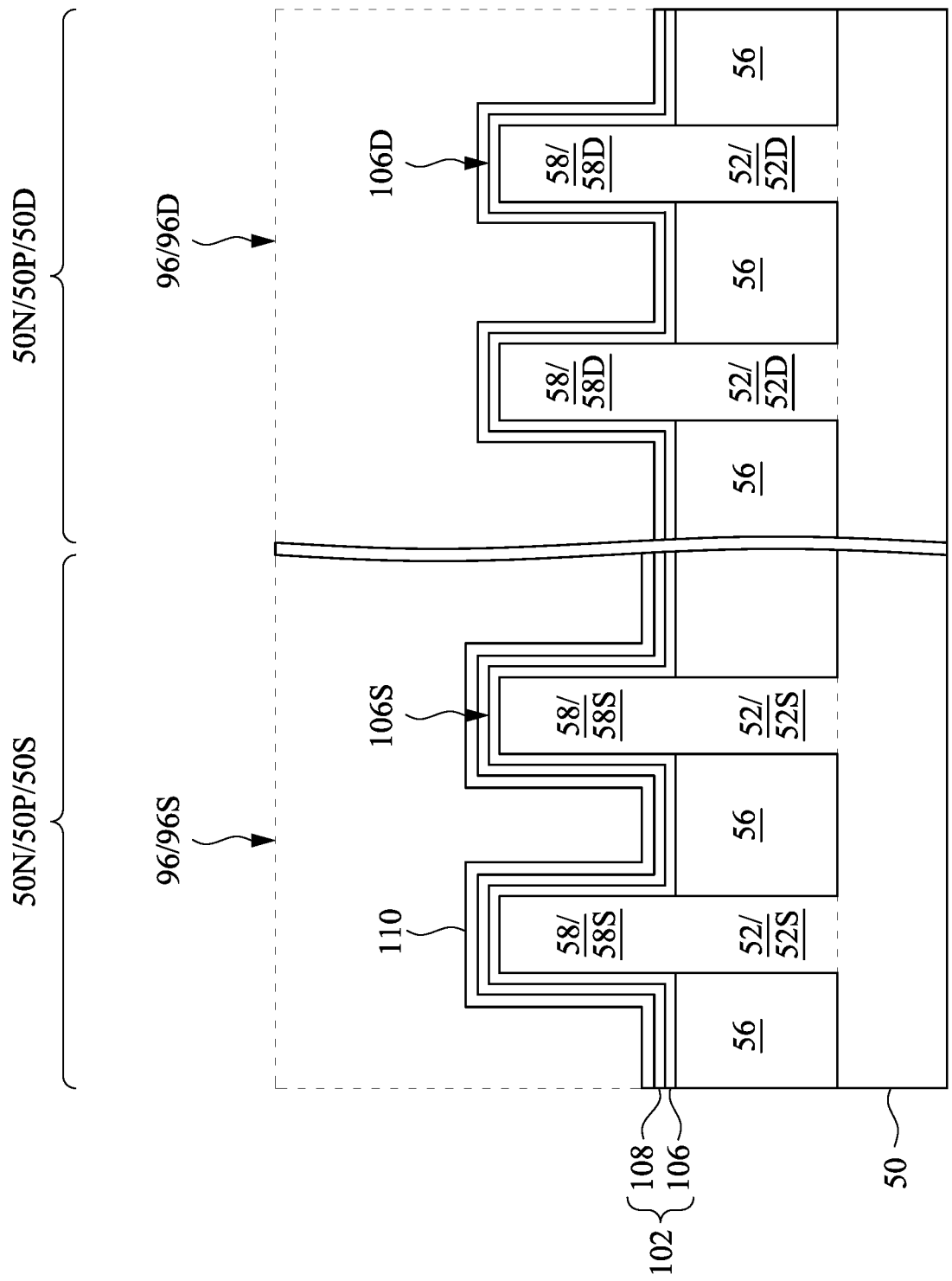
Figure 12B:
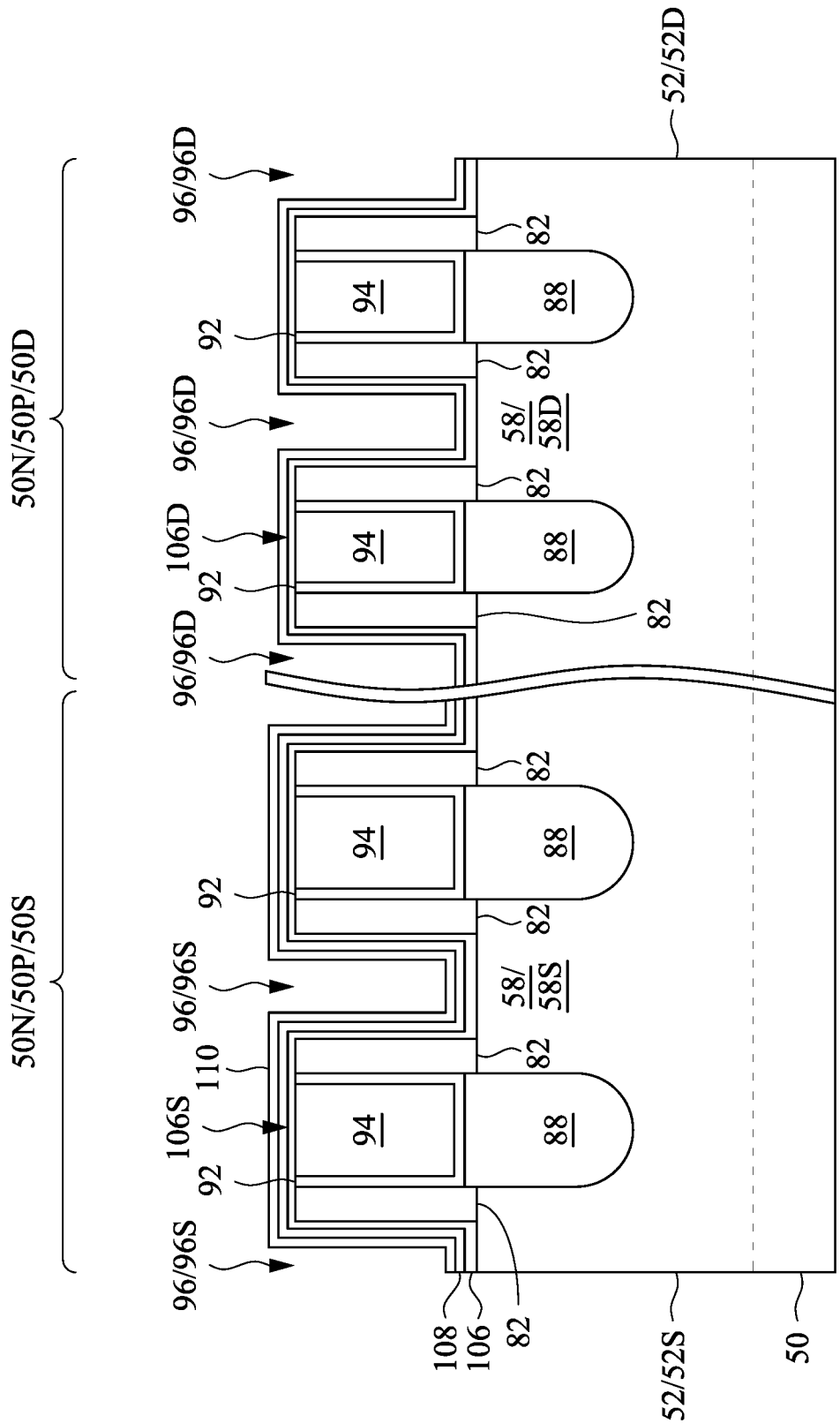

In FIGS. 12A-12B, a capping layer 110 is formed on the gate dielectric layer 102 (and specifically, on the high-k dielectric layer 108) in the sparse region 50S. The dense region 50D is free of the capping layer 110, such that the high-k dielectric layer 108 in the dense region 50D is exposed and the high-k dielectric layer 108 in the sparse region 50S is covered by the capping layer 110. The capping layer 110 thus overlaps the portions of the interfacial layer 106S above the channel regions 58S, and does not overlap the portions of the interfacial layer 106D above the channel regions 58D. The capping layer 110 is formed of an oxygen-containing material, which may be formed by a suitable deposition process such as CVD, PVD, ALD, or the like. Thus, the capping layer 110 comprises oxygen. An anneal process will be subsequently performed to drive the oxygen from the capping layer 110 into the interfacial layer 106 (and through the high-k dielectric layer 108), thereby increasing the thickness of the portions of the interfacial layer 106S on the channel regions 58S. The material of the capping layer 110 is one that is capable of promoting growth of the material of the interfacial layer 106, and has a high etching selectivity from the high-k dielectric layer 108. In some embodiments, the capping layer 110 is formed of a metal oxide or a metal oxynitride, such as titanium oxide, aluminum oxide, tungsten oxide, tantalum oxide, titanium oxynitride, aluminum oxynitride, tungsten oxynitride, tantalum oxynitride, combinations thereof, or the like. The capping layer 110 may be formed by conformally depositing the oxygen-containing material in both the sparse region 50S and the dense region 50D, and subsequently etching the oxygen-containing material to remove portions of the capping layer 110 in the dense region 50D. The capping layer 110 may be formed to a greater thickness than the gate dielectric layer 102. In some embodiments, the capping layer 110 is formed to a thickness in the range of 1 nm to 10 nm.

Figure 13A:
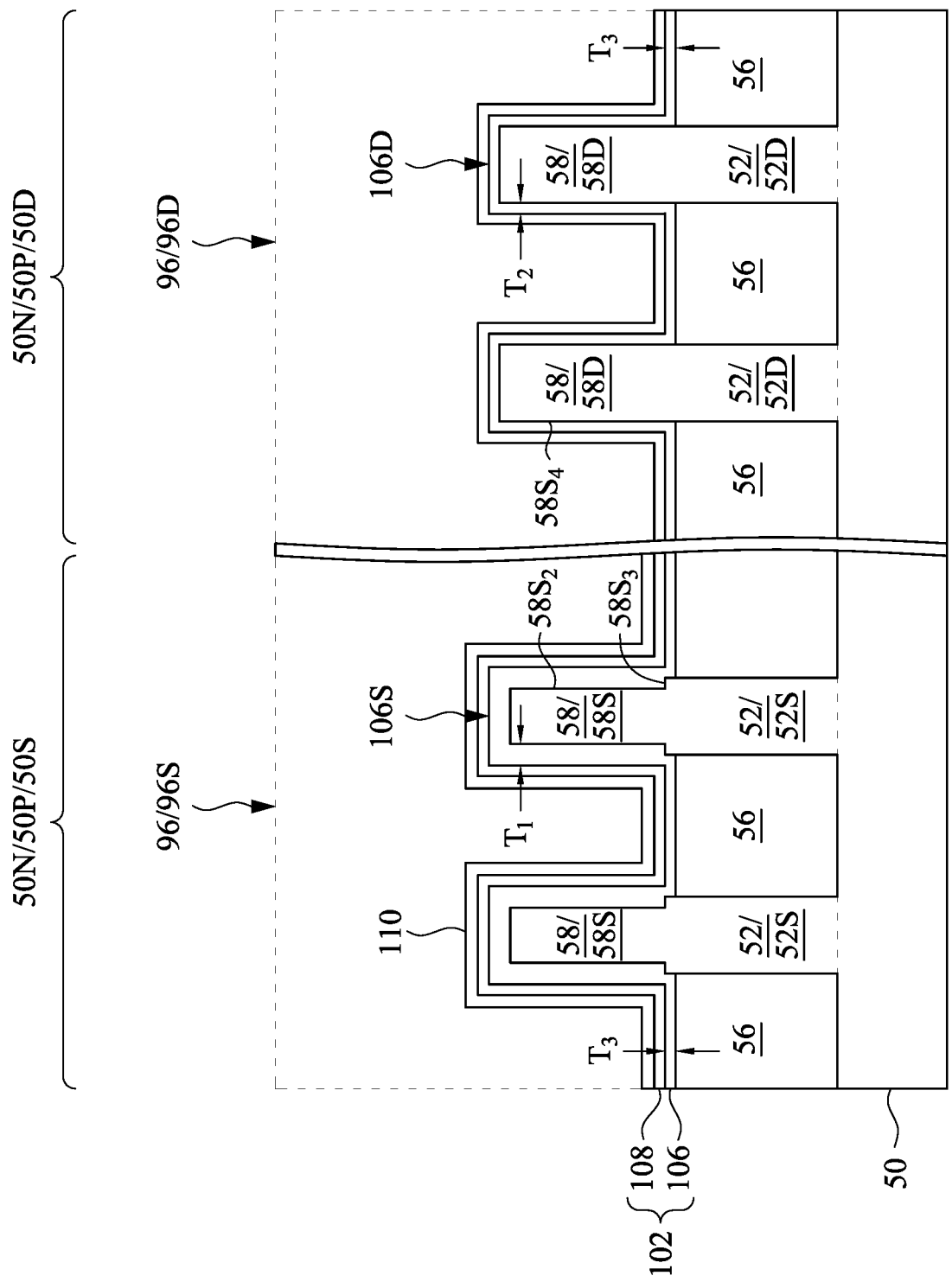
Figure 13B:
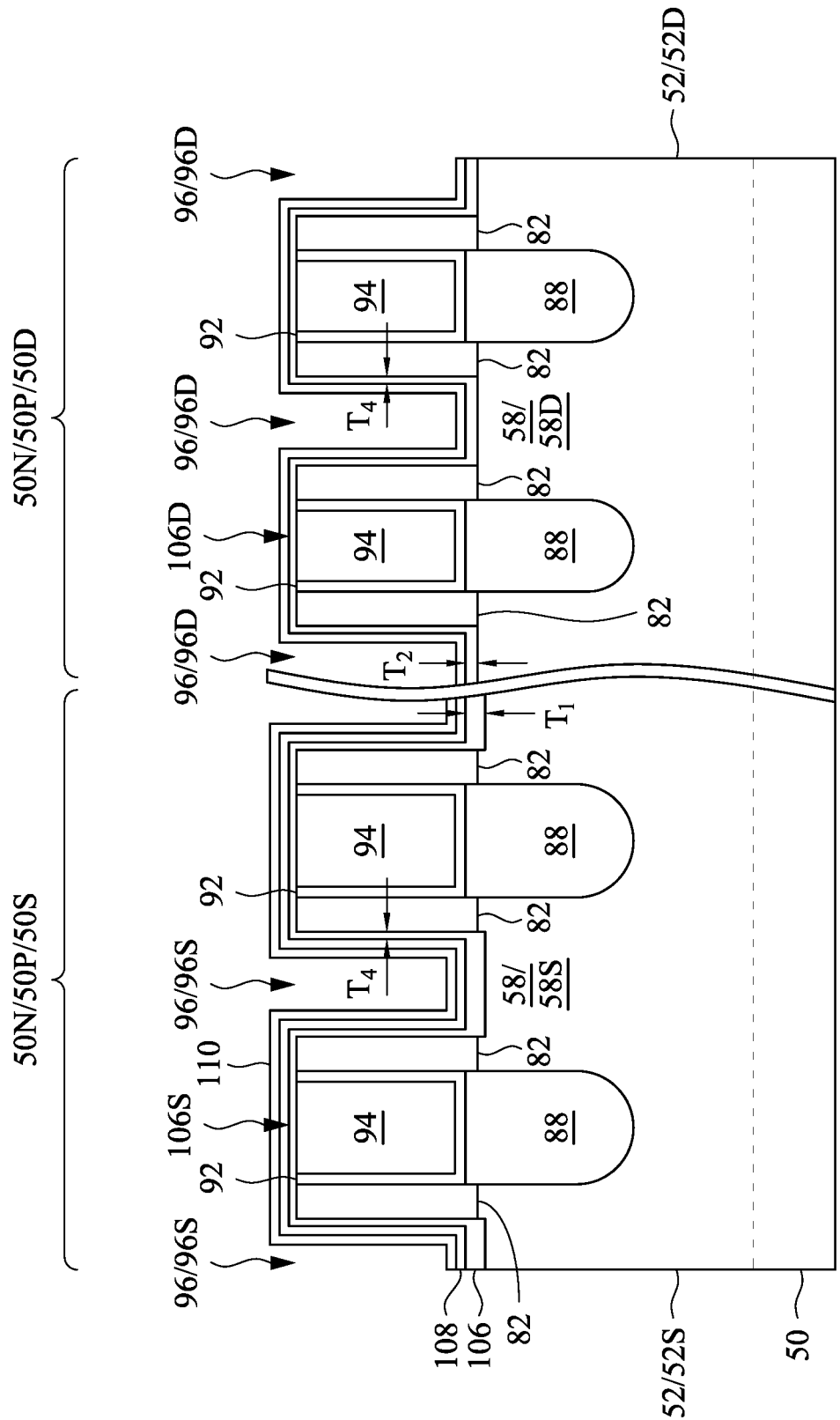

In FIGS. 13A-13B, an anneal process is performed to drive oxygen from the capping layer 110 into the interfacial layer 106 (and through the high-k dielectric layer 108), thereby increasing the thickness $T_1$ of the portions of the interfacial layer 106S on the channel regions 58S. Specifically, the anneal process increases the thickness $T_1$ of the portions of the interfacial layer 106S that extend along the sidewalls and the top surfaces of the channel regions 58S in the sparse region 50S. In some embodiments, the thickness $T_1$ of the portions of the interfacial layer 106S on the channel regions 58S is increased by an amount in the range of 0.5 nm to 2 nm. In some embodiments, after the anneal process the portions of the interfacial layer 106S on the channel regions 58S have a thickness $T_1$ in the range of 1.5 nm to 2.5 nm.

The anneal process does not increase the thickness $T_2$ of the portions of the interfacial layer 106D in the dense region 50D, the thickness $T_3$ of the portions of the interfacial layer 106S that extend along the STI regions 56, or the thickness $T_4$ of the portions of the interfacial layer 106S that extend along the gate spacers 82. In some embodiments, after the anneal process the portions of the interfacial layer 106D on the channel regions 58D have a thickness $T_2$ in the range of 0.5 nm to 1.5 nm. Thus, after the anneal process, the portions of the interfacial layer 106S on the channel regions 58S are thicker than the portions of the interfacial layer 106D on the channel regions 58D. The portions of the interfacial layer 106S on the STI regions 56 in the sparse region 50S have substantially the same thickness (within process variations) as the portions of the interfacial layer 106D on the STI regions 56 in the dense region 50D. In some embodiments, after the anneal process the portions of the interfacial layer 106 that extend along the STI regions 56 have a thickness $T_3$ in the range of 0 nm to 1.5 nm. The portions of the interfacial layer 106S on the gate spacers 82 in the sparse region 50S have substantially the same thickness (within process variations) as the portions of the interfacial layer 106D on the gate spacers 82 in the dense region 50D. In some embodiments, after the anneal process the portions of the interfacial layer 106 that extend along the gate spacers 82 have a thickness $T_4$ in the range of 0 nm to 1.5 nm.

Increasing the thickness $T_1$ of the portions of the interfacial layer 106S on the channel regions 58S can reduce the leakage current of the devices in the sparse region 50S, which may be advantageous when the devices in the sparse region 50S are devices that operate at a high voltage, such as input/output devices. The performance of the input/output devices may thus be improved. Because the capping layer 110 is not formed on the gate dielectric layer 102 in the dense region 50D, the thickness $T_2$ of the portions of the interfacial layer 106D in the dense region 50D is not increased by the anneal process, which may be advantageous when the devices in the dense region 50D are devices that operate at a low voltage, such as logic devices.

In some embodiments, the thickness $T_1$ of the portions of the interfacial layer 106S on the channel regions 58S is increased as a result of oxidizing portions of the fins 52S in the sparse region 50S. The oxidized portions of the fins 52S in the sparse region 50S are converted to the material of the interfacial layer 106 (e.g., silicon oxide). As a result, the width and the height of portions of the fins 52S in the sparse region 50S, such as the portions underlying the recesses 96 (and subsequently formed gate structures) are decreased by the anneal process. Put another way, the width and the height of the channel regions 58S in the sparse region 50S are decreased by the anneal process. In some embodiments, the height of the channel regions 58S in the sparse region 50S is decreased by an amount in the range of 0.2 nm to 1 nm, and the width of the channel regions 58S in the sparse region 50S is decreased by an amount in the range of 0.4 nm to 2 nm. Other portions of the fins 52S in the sparse region 50S, such as the portions underlying the gate spacers 82, do not have their width or height decreased by the anneal process. Additionally, the fins 52D (including the channel regions 58D) in the dense region 50D do not have their width or height decreased by the anneal process. As such, the channel regions 58D of the fins 52D in the dense region 50D have a greater width and have a greater height than the channel regions 58S in the sparse region 50S. The widths of the channel regions 58S, 58D are measured in a direction perpendicular to the longitudinal axes of the fins 52.

Accordingly, the channel regions 58S in the sparse region 50S have a stairstep shape, such that a side of a fin 52S has a first sidewall $58S_1$, a second sidewall $58S_2$, and an indented stairstep surface $58S_3$, where the first sidewall $58S_1$ and the second sidewall $58S_2$ lie in different planes and are connected by the indented stairstep surface $58S_3$. The first sidewalls $58S_1$ and the second sidewalls $58S_2$ are substantially perpendicular (within process variations) to a major surface of the substrate 50. The interfacial layer 106 extends along the first sidewalls $58S_1$, the second sidewalls $58S_2$, and the indented stairstep surfaces $58S_3$ of the channel regions 58S. In some embodiments, the stairstep surfaces $58S_3$ have a width in the range of 0.2 nm to 1 nm. In this embodiment, the stairstep surfaces $58S_3$ are substantially flat (within process variations), such that the indented stairstep surfaces $58S_3$ are substantially parallel (within process variations) to the major surface of the substrate 50. In another embodiment (subsequently described for FIG. 21), the stairstep surfaces $58S_3$ are convex. The channel regions 58D in the dense region 50D do not have a stairstep shape, such that a side of a fin 52D has a single sidewall $58S_4$ that lies in a single plane.

In this embodiment, the top surfaces of the channel regions 58S in the sparse region 50S are substantially flat (within process variations) after the anneal process. The top surfaces of the channel regions 58D in the dense region 50D are substantially flat (within process variations) after the anneal process. In another embodiment (subsequently described for FIG. 21), the top surfaces of the channel regions 58S are convex after the anneal process.

The temperature and duration of the anneal process are controlled to increase the thickness $T_1$ of the portions of the interfacial layer 106S (and reduce the width and the height of the channel regions 58S) in the sparse region 50S by a desired amount. In some embodiments, the capping layer 110 and the interfacial layer 106 are annealed at a temperature in the range of 400° C. to 1100° C., for a duration in the range of 1 second to 300 seconds, and at a pressure in the range of 1 Torr to 500 Torr. Performing the anneal process at a temperature of less than 400° C. and/or for a duration of less than 1 second may not sufficiently increase the thickness $T_1$ of the portions of the interfacial layer 106S on the channel regions 58S, negatively affecting the leakage current of the devices. Performing the anneal process at a temperature of greater than 1100° C. and/or for a duration of greater than 300 seconds may excessively increase the thickness $T_1$ of the portions of the interfacial layer 106S on the channel regions 58S, negatively affecting the junction profile of the epitaxial source/drain regions 88.

Figure 14A:
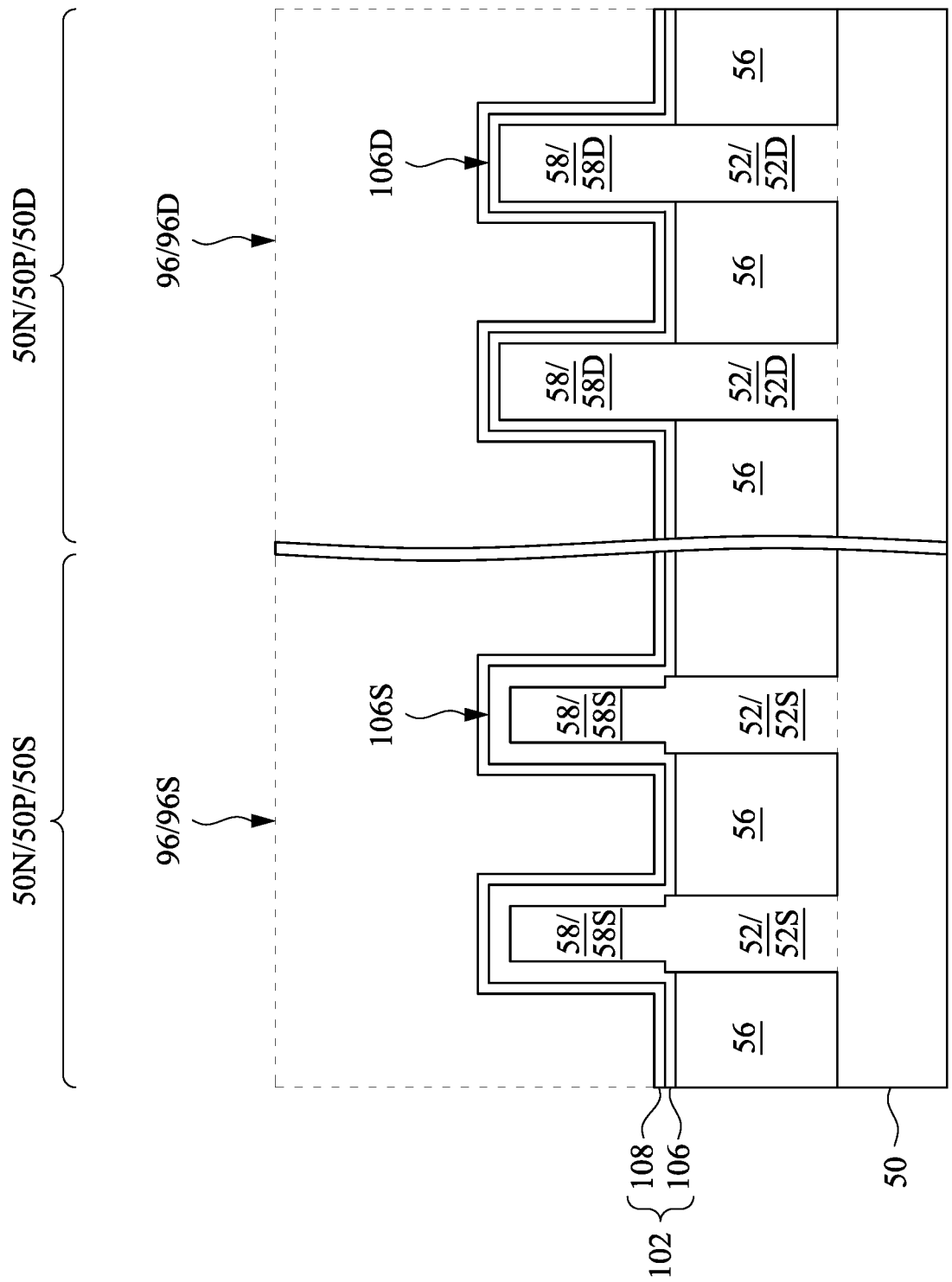
Figure 14B:
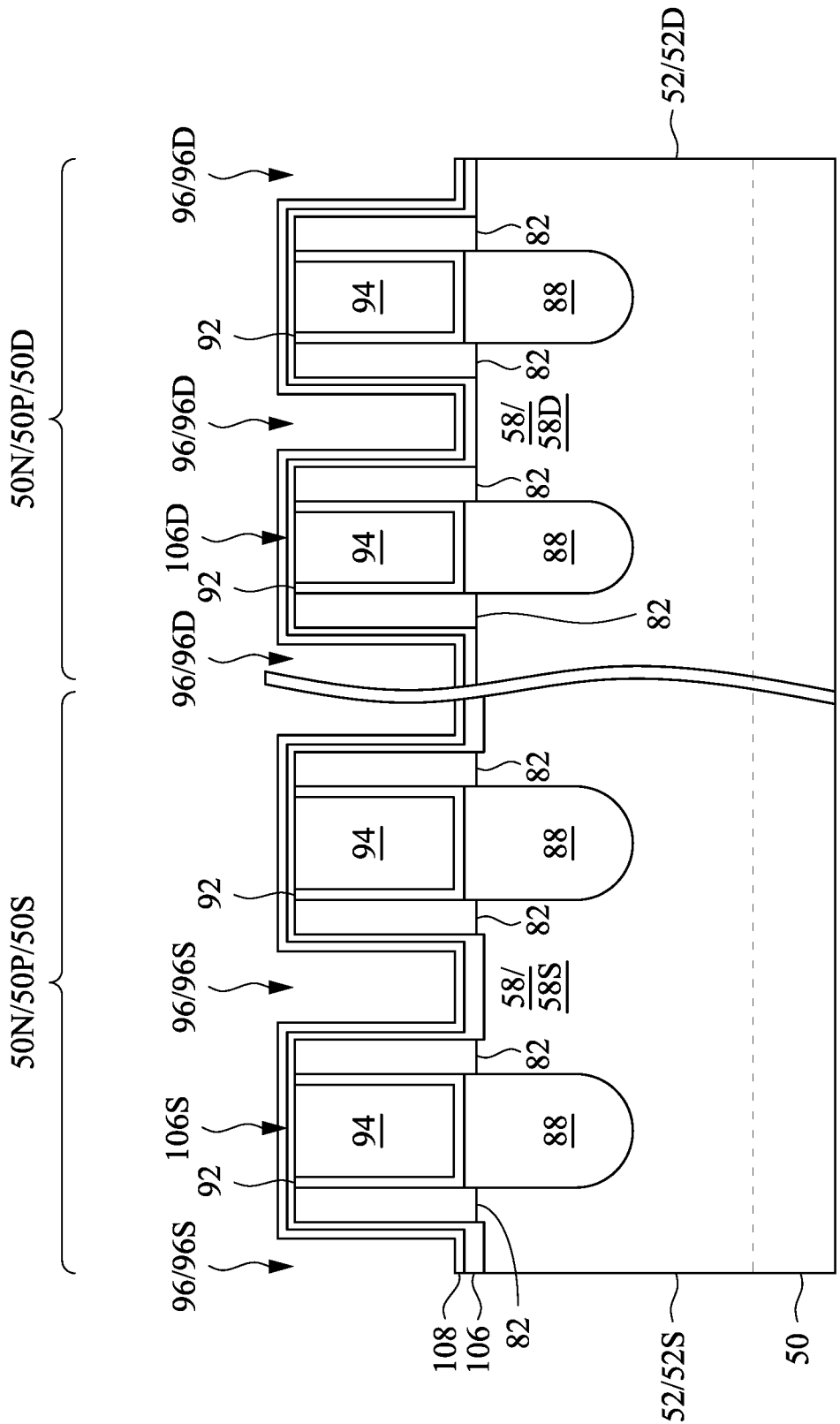

In FIGS. 14A-14B, the capping layer 110 is removed to expose the portions of the interfacial layer 106S in the sparse region 50S. The capping layer 110 may be removed using any acceptable etching process, such as one that is selective to the material of the capping layer 110 (e.g., selectively etches the material of the capping layer 110 at a faster rate than the material of the high-k dielectric layer 108). In some embodiments, a wet etch is performed using a mixture of an oxidant (e.g., hydrogen peroxide ($H_2O_2$), water ($H_2O$), or the like), an acid (e.g., hydrogen chloride (HCl) or the like), and an alkali (e.g., ammonium hydroxide ($NH_4OH$) or the like). In some embodiments, a dry etch is performed using a mixture of an oxidant (e.g., oxygen ($O_2$), ozone ($O_3$), hydrogen peroxide ($H_2O_2$), or the like) and a fluorine-based gas (e.g., hydrogen fluoride (HF), nitrogen trifluoride ($NF_3$), sulfur hexafluoride ($SF_6$), carbon tetrafluoride ($CF_4$), or the like). In some embodiments, a combination of a wet etch and a dry etch is performed.

In some embodiments, a multi-cycle process is performed in which the processes described for FIGS. 12A-14B are repeated one or more times. The thickness $T_1$ of the portions of the interfacial layer 106S on the channel regions 58S is increased by a substantially similar (within process variations) amount each cycle. The cycles may be performed until the thickness $T_1$ of the portions of the interfacial layer 106S on the channel regions 58S is increased by a desired amount.

Figure 15A:
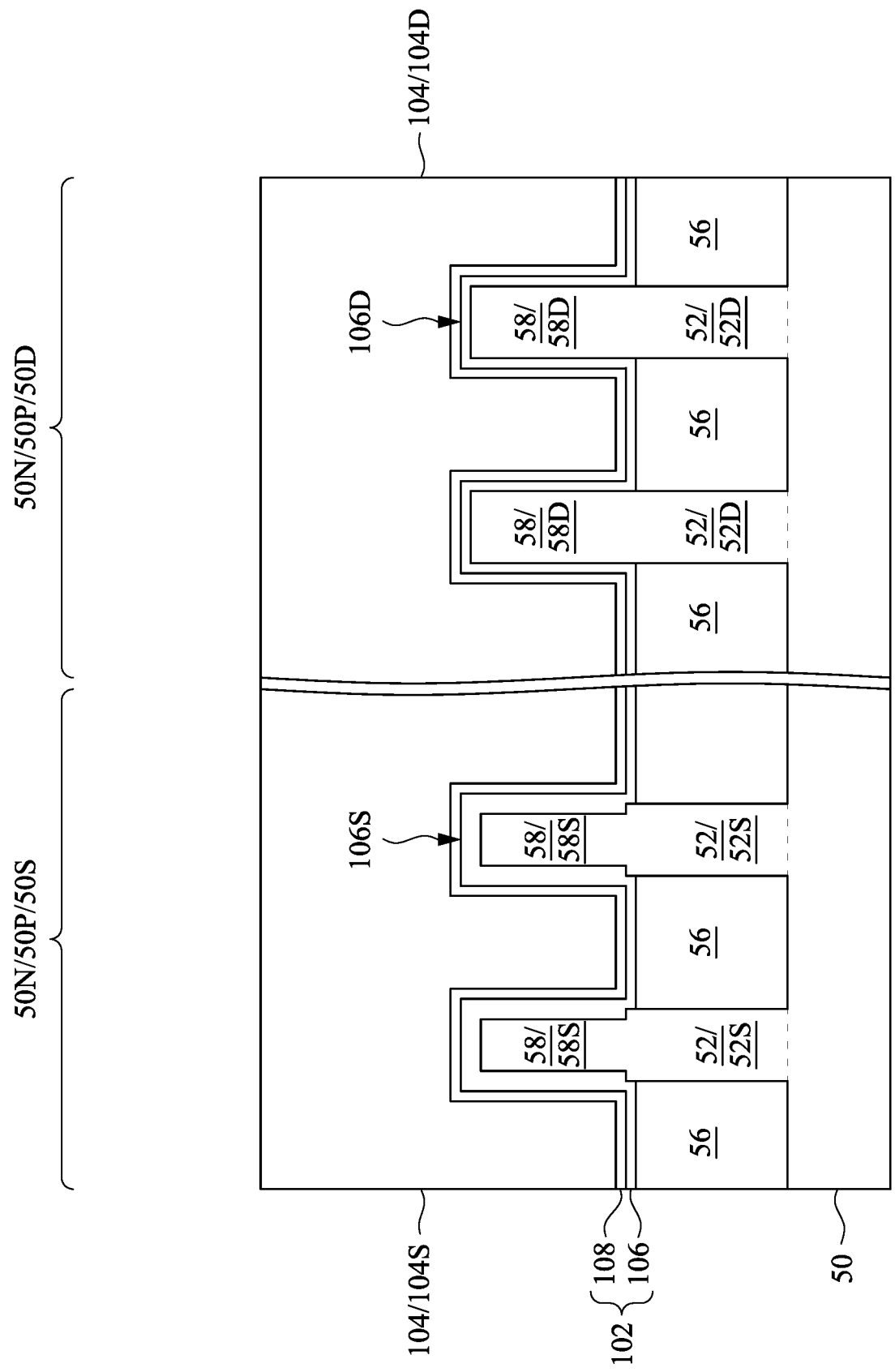
Figure 15B:
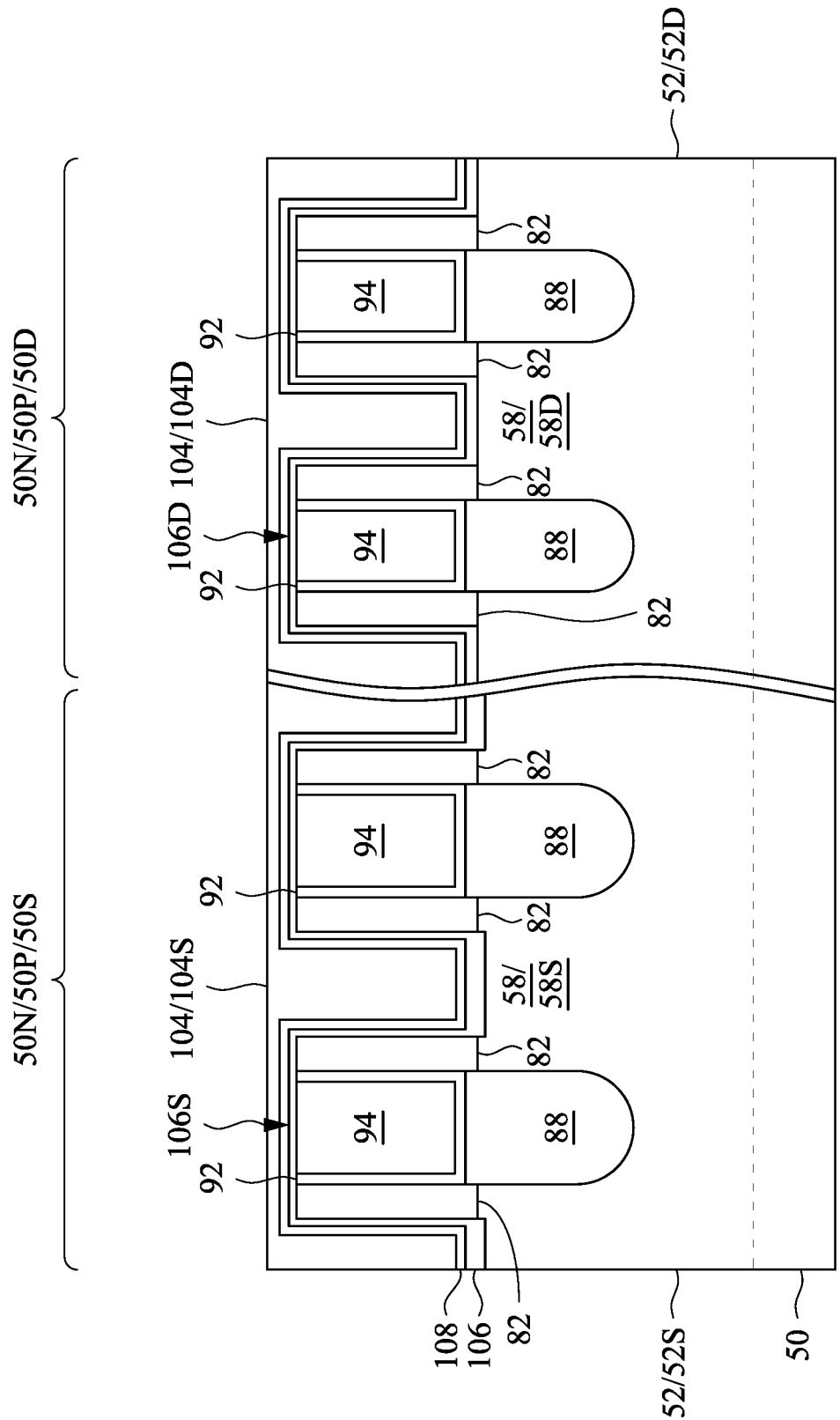

In FIGS. 15A-15B, a gate electrode layer 104 is formed on the gate dielectric layer 102. The gate electrode layer 104 may include a metal-containing material such as titanium nitride, titanium oxide, tantalum nitride, tantalum carbide, tungsten, cobalt, ruthenium, aluminum, combinations thereof, multi-layers thereof, or the like. Although a single-layered gate electrode layer 104 is illustrated, the gate electrode layer 104 may include any number of work function tuning layers, any number of barrier layers, any number of glue layers, and a fill material.

The formation of the gate dielectric layer 102 in the sparse region 50S and the dense region 50D occurs simultaneously such that the gate dielectric layer 102 in the sparse region 50S and the dense region 50D is formed of the same material(s). The formation of the gate electrode layer 104 may occur simultaneously such that the gate electrode layer 104 in the sparse region 50S and the dense region 50D is formed of the same material(s). In some embodiments, the gate electrode layers 104S in the sparse region 50S are formed by a distinct process from the gate electrode layers 104D in the dense region 50D, such that the gate electrode layers 104S, 104D may be different materials and/or have a different number of layers. Additionally, the gate electrode layers 104 in the n-type region 50N and the p-type region 50P may be formed by distinct processes, such that the gate electrode layers 104 may be different materials and/or have a different number of layers. Various masking steps may be used to mask and expose appropriate regions when using distinct processes.

Figure 16A:
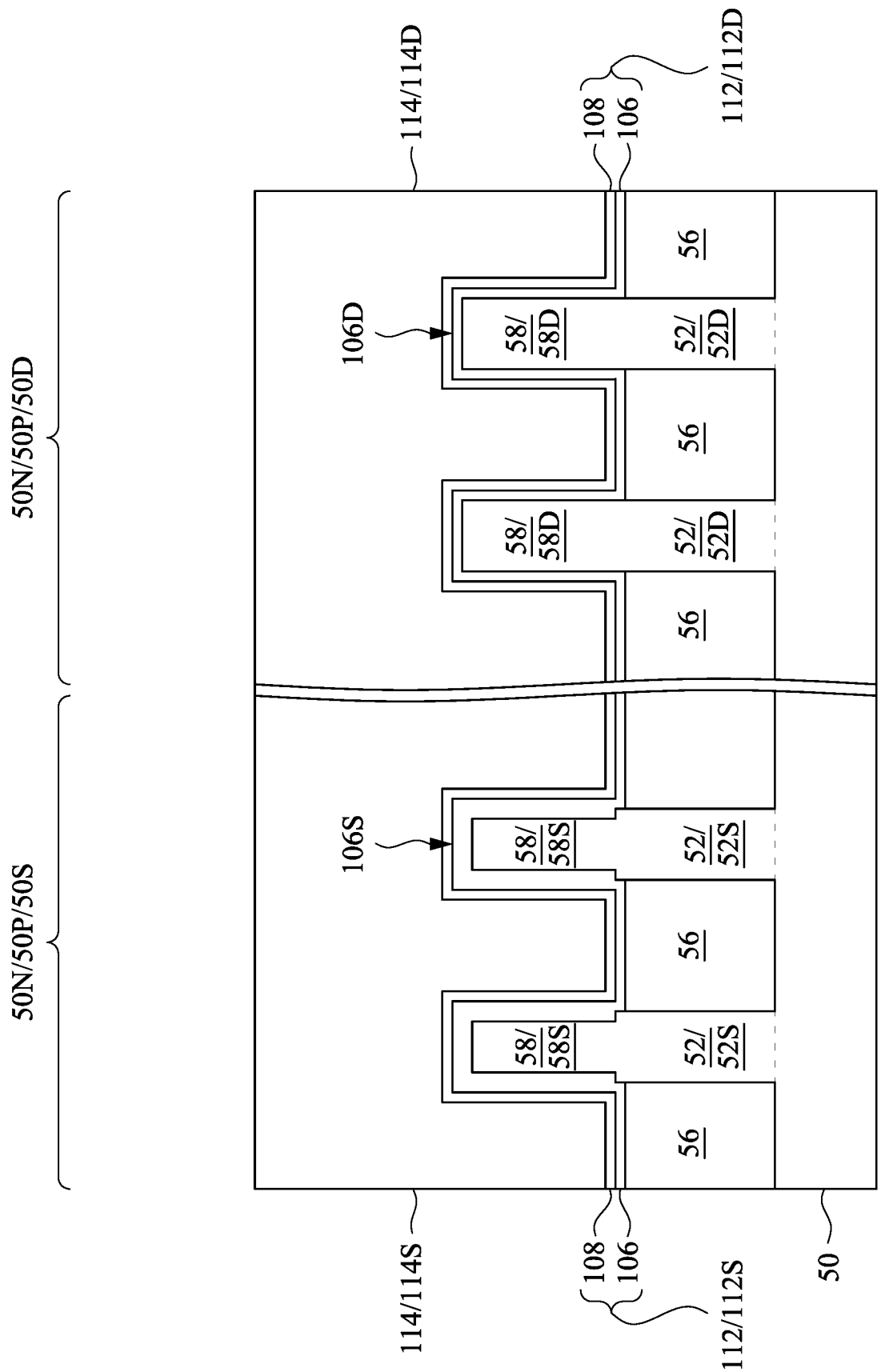
Figure 16B:
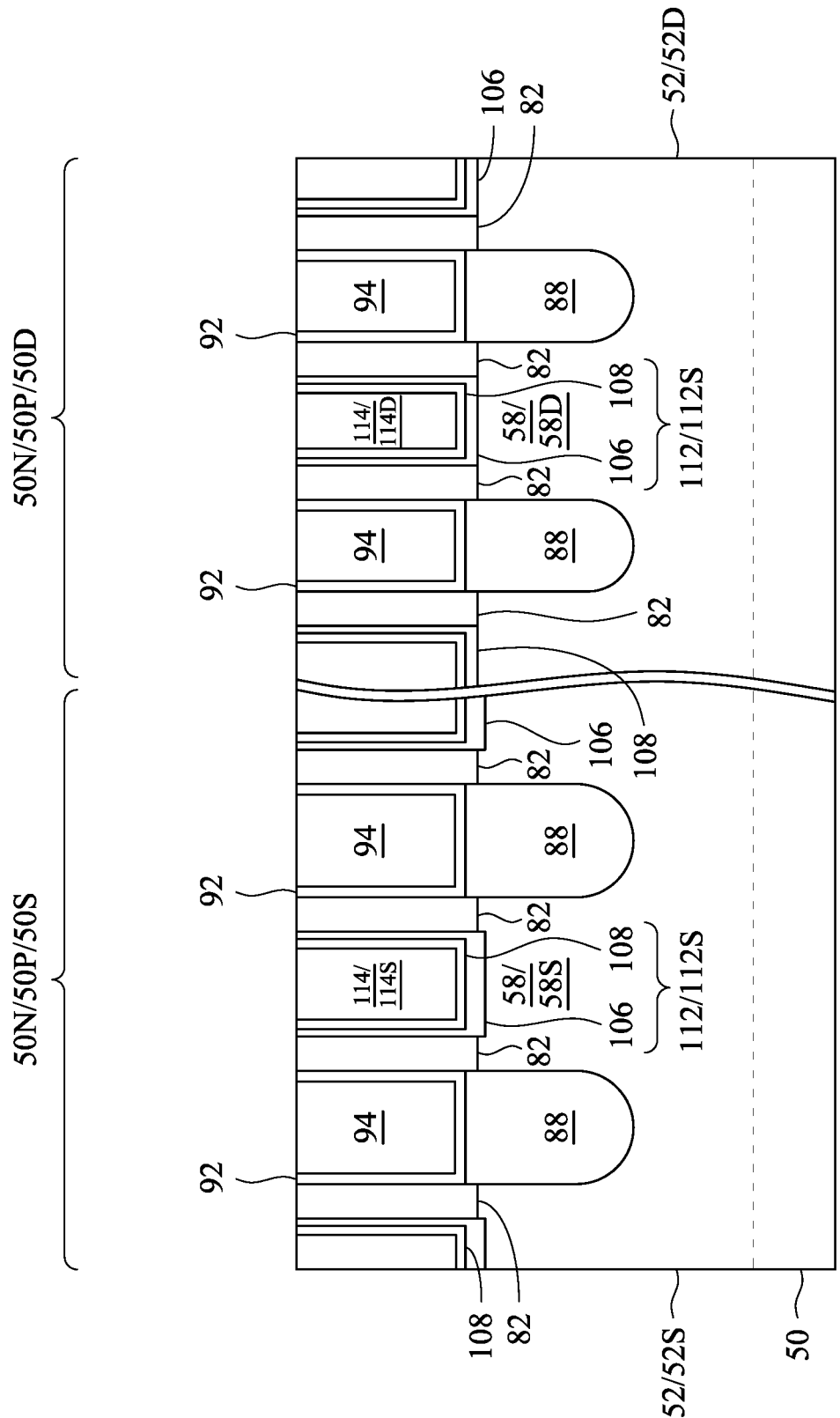

In FIGS. 16A-16B, a removal process is performed to remove the excess portions of the materials of the gate dielectric layer 102 and the gate electrode layer 104, which excess portions are over the top surfaces of the first ILD 94, the CESL 92, and the gate spacers 82, thereby forming gate dielectrics 112 and gate electrodes 114. In some embodiments, a planarization process such as a chemical mechanical polish (CMP), an etch-back process, combinations thereof, or the like may be utilized. The gate dielectric layer 102, when planarized, has portions left in the recesses 96 (thus forming the gate dielectrics 112). The gate dielectrics 112S in the sparse region 50S include the remaining portions of the interfacial layer 106S in the sparse region 50S, and the gate dielectrics 112D in the dense region 50D include the remaining portions of the interfacial layer 106D in the dense region 50D. The gate electrode layer 104, when planarized, has portions left in the recesses 96 (thus forming the gate electrodes 114). The gate electrodes 114S in the sparse region 50S include the remaining portions of the gate electrode layers 104S in the sparse region 50S, and the gate electrodes 114D in the dense region 50D include the remaining portions of the gate electrode layers 104D in the dense region 50D. After the planarization process, the top surfaces of the gate spacers 82, the CESL 92, the first ILD 94, the gate dielectrics 112, and the gate electrodes 114 are substantially coplanar (within process variations). The gate dielectrics 112 and the gate electrodes 114 form replacement gates of the resulting FinFETs. Each respective pair of a gate dielectric 112 and a gate electrode 114 may be collectively referred to as a "gate structure." The gate structures each extend along top surfaces, sidewalls, and bottom surfaces of a channel region 58 of a fin 52. The gate structures (including the gate dielectrics 112S and the gate electrodes 114S) in the sparse region 50S are wider than the gate structures (including the gate dielectrics 112D and the gate electrodes 114D) in the dense region 50D. The widths of the gate structures are measured in a direction parallel to the longitudinal axes of the fins 52.

Figure 17A:
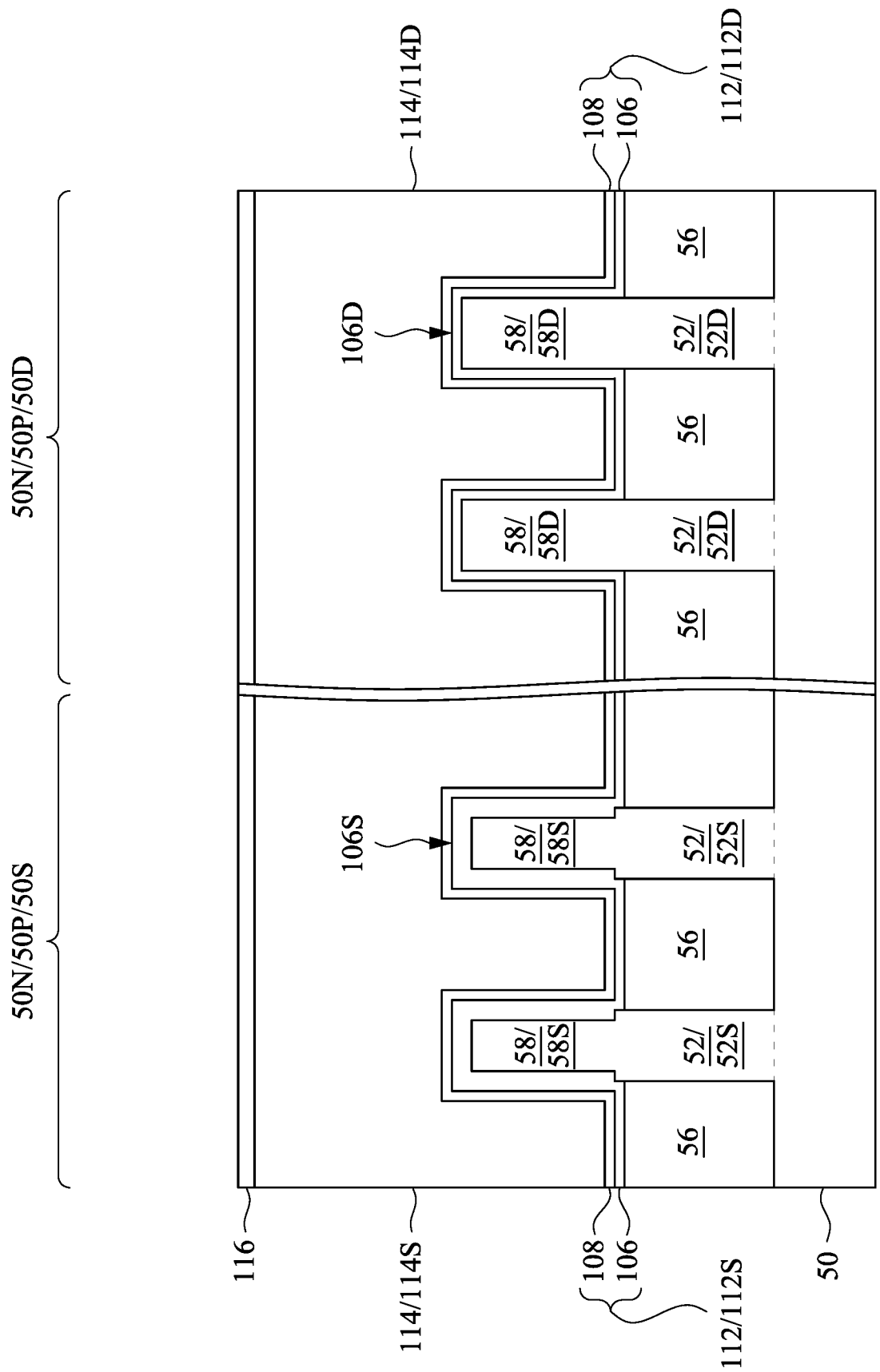
Figure 17B:
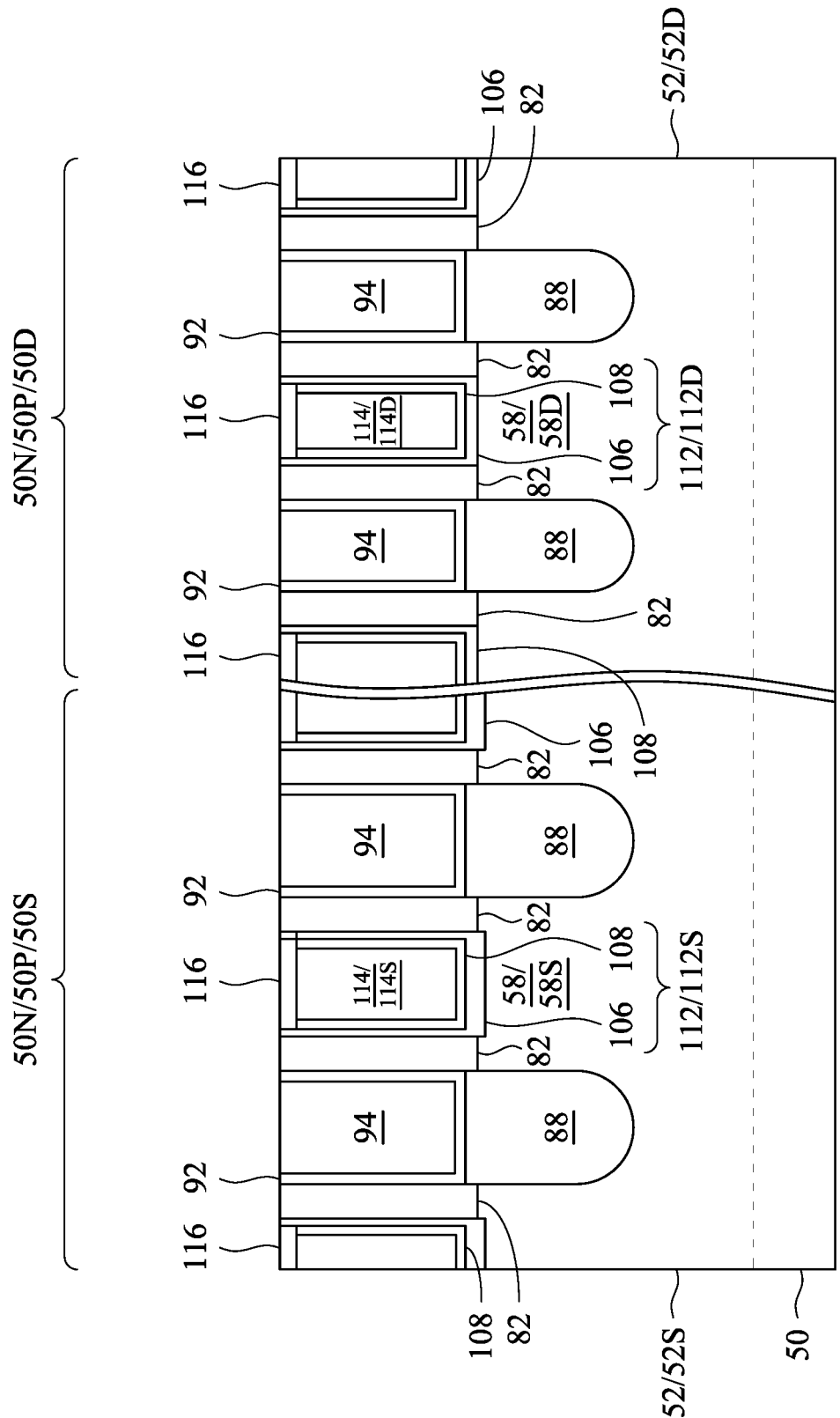

In FIGS. 17A-17B, gate masks 116 are formed over the gate structures (including the gate dielectrics 112 and the gate electrodes 114). In some embodiments, the gate masks 116 may also be formed over the gate spacers 82. Gate contacts will be subsequently formed to penetrate through the gate masks 116 to contact the top surfaces of the gate electrodes 114.

As an example to form the gate masks 116, the gate structures (including the gate dielectrics 112 and the gate electrodes 114) may be recessed using any acceptable etching process. In some embodiments (not separately illustrated), the gate spacers 82 are also recessed. Dielectric material(s) are then conformally deposited in the recesses. Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like. Other insulation materials formed by any acceptable process may be used. A removal process is performed to remove the excess portions of the dielectric material(s), which excess portions are over the top surfaces of the first ILD 94, thereby forming the gate masks 116. In some embodiments, a planarization process such as a chemical mechanical polish (CMP), an etch-back process, combinations thereof, or the like may be utilized. The dielectric material(s), when planarized, have portions left in the recesses (thus forming the gate masks 116). After the planarization process, the top surfaces of the gate spacers 82, the CESL 92, the first ILD 94, and the gate masks 116 are substantially coplanar (within process variations).

Figure 18A:
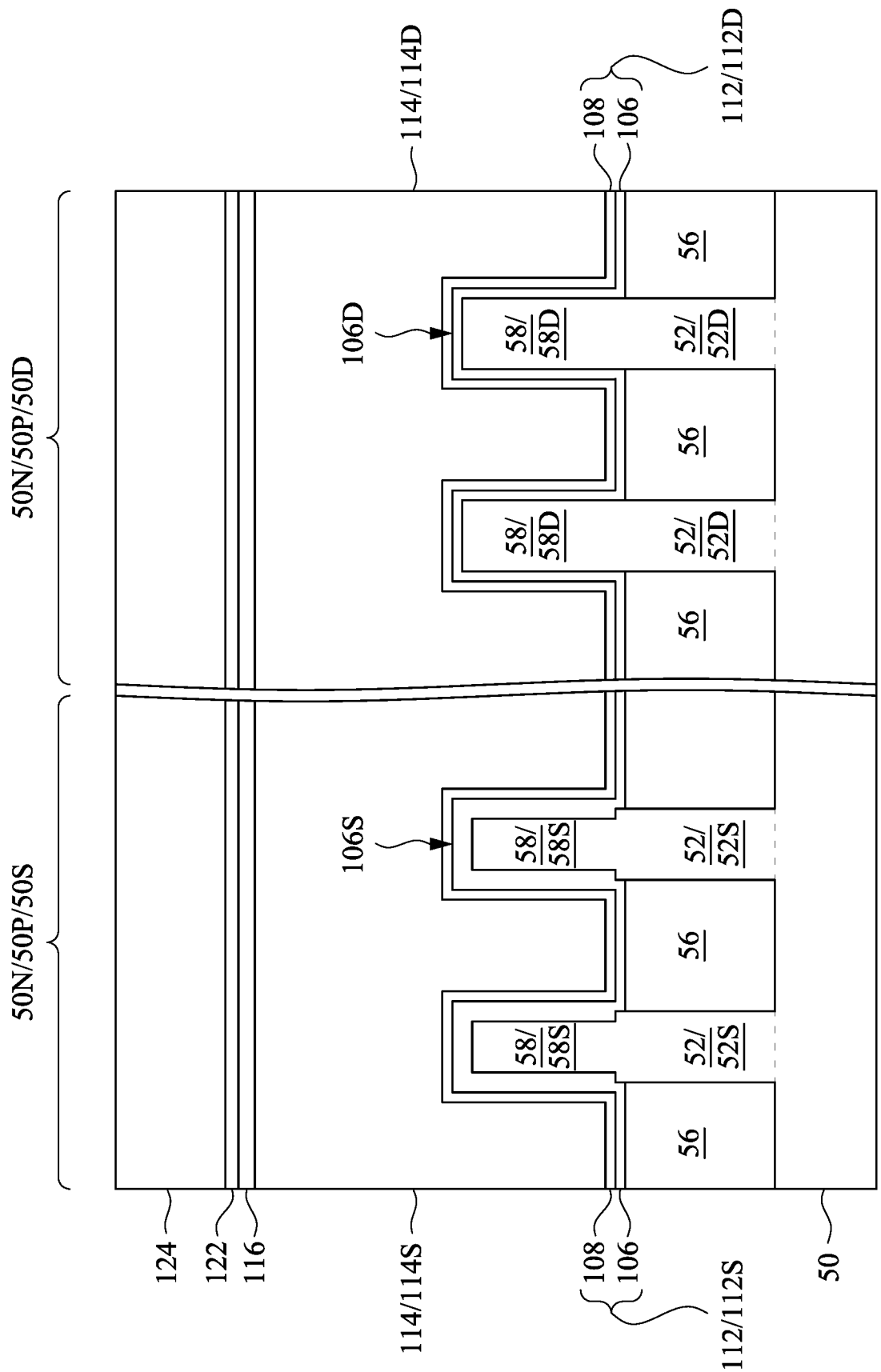
Figure 18B:
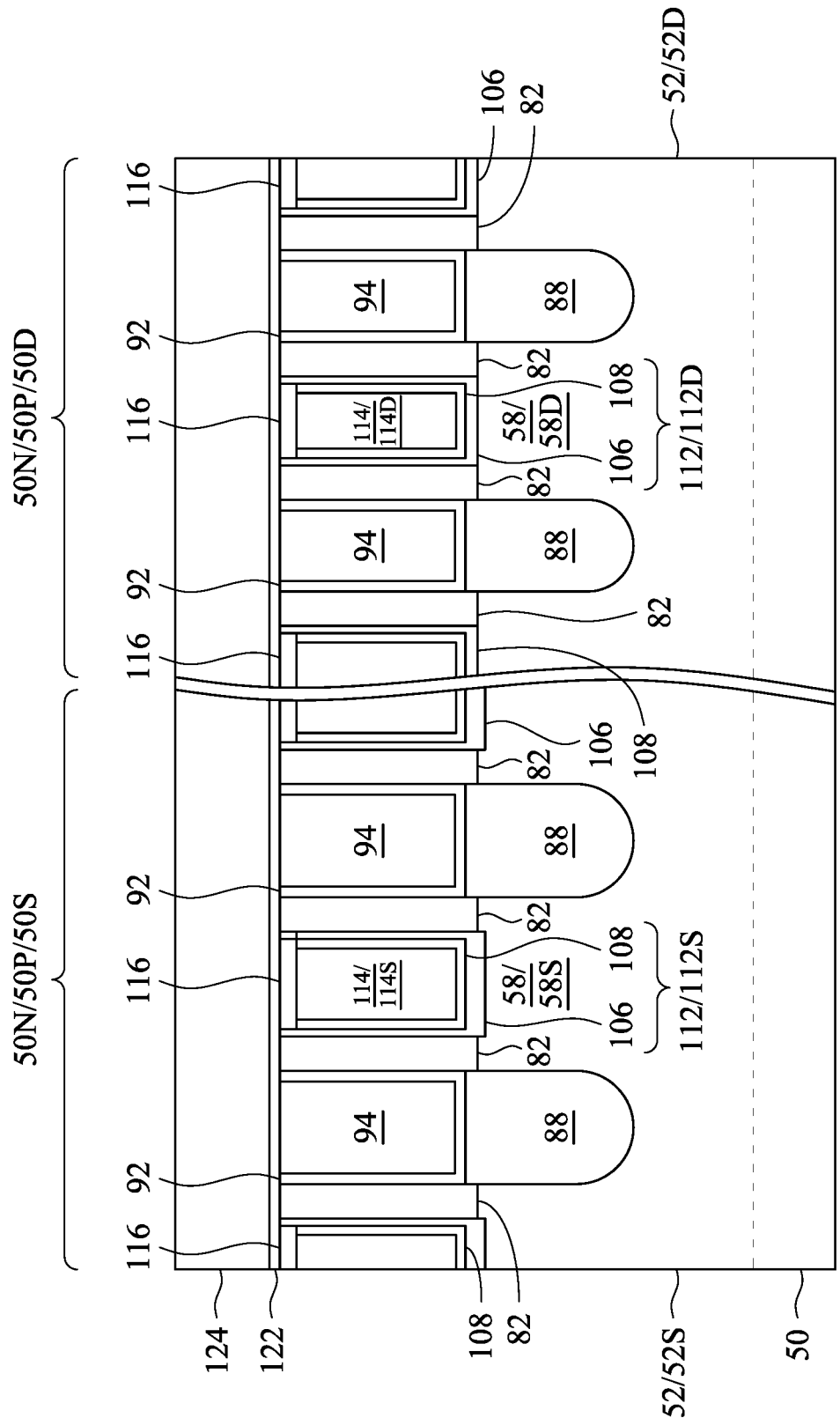

In FIGS. 18A-18B, a second ILD 124 is deposited over the gate spacers 82, the CESL 92, the first ILD 94, and the gate masks 116. In some embodiments, the second ILD 124 is a flowable film formed by a flowable CVD method. In some embodiments, the second ILD 124 is formed of a dielectric material such as PSG, BSG, BPSG, USG, or the like, which may be deposited by any suitable method, such as CVD, PECVD, or the like.

In some embodiments, an etch stop layer (ESL) 122 is formed between the second ILD 124 and the gate spacers 82, the CESL 92, the first ILD 94, and the gate masks 116. The ESL 122 may include a dielectric material, such as, silicon nitride, silicon oxide, silicon oxynitride, or the like, having a high etching selectivity from the etching of the second ILD 124.

Figure 19A:
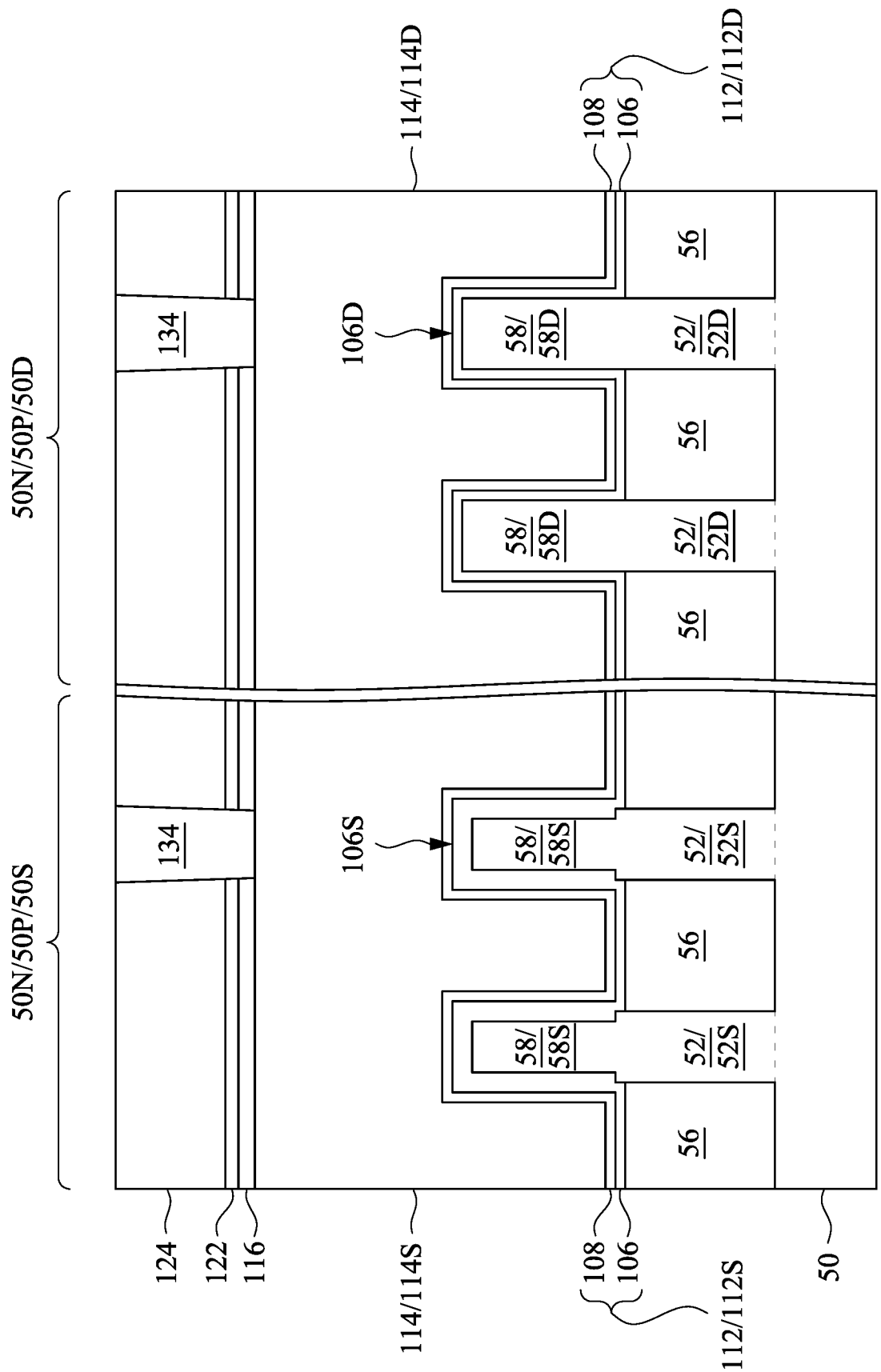
Figure 19B:
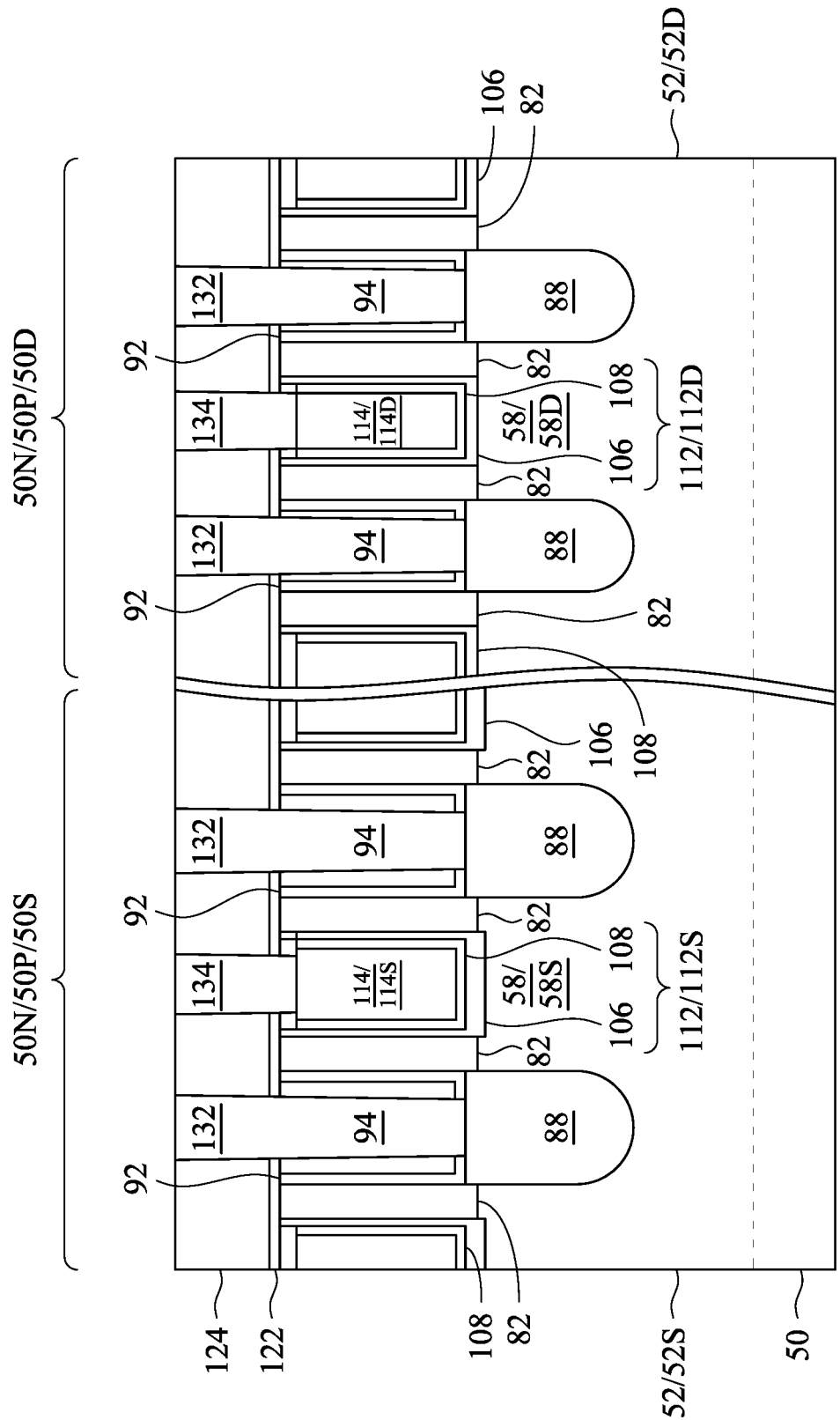

In FIGS. 19A-19B, source/drain contacts 132 and gate contacts 134 are formed to contact, respectively, the epitaxial source/drain regions 88 and the gate electrodes 114. The source/drain contacts 132 are physically and electrically coupled to the epitaxial source/drain regions 88. The gate contacts 134 are physically and electrically coupled to the gate electrodes 114.

As an example to form the source/drain contacts 132 and the gate contacts 134, openings for the source/drain contacts 132 are formed through the second ILD 124, the ESL 122, the first ILD 94 (see FIGS. 18A-18B), and the CESL 92, and openings for the gate contacts 134 are formed through the second ILD 124, the ESL 122, and the gate masks 116 (see FIGS. 18A-18B). The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the second ILD 124. The remaining liner and conductive material form the source/drain contacts 132 and the gate contacts 134 in the openings. An anneal process may be performed to form a silicide at the interface between the epitaxial source/drain regions 88 and the source/drain contacts 132. The source/drain contacts 132 and the gate contacts 134 may be formed in distinct processes, or may be formed in the same process. Although shown as being formed in the same cross-sections, it should be appreciated that each of the source/drain contacts 132 and the gate contacts 134 may be formed in different cross-sections, which may avoid shorting of the contacts.

Figure 20:
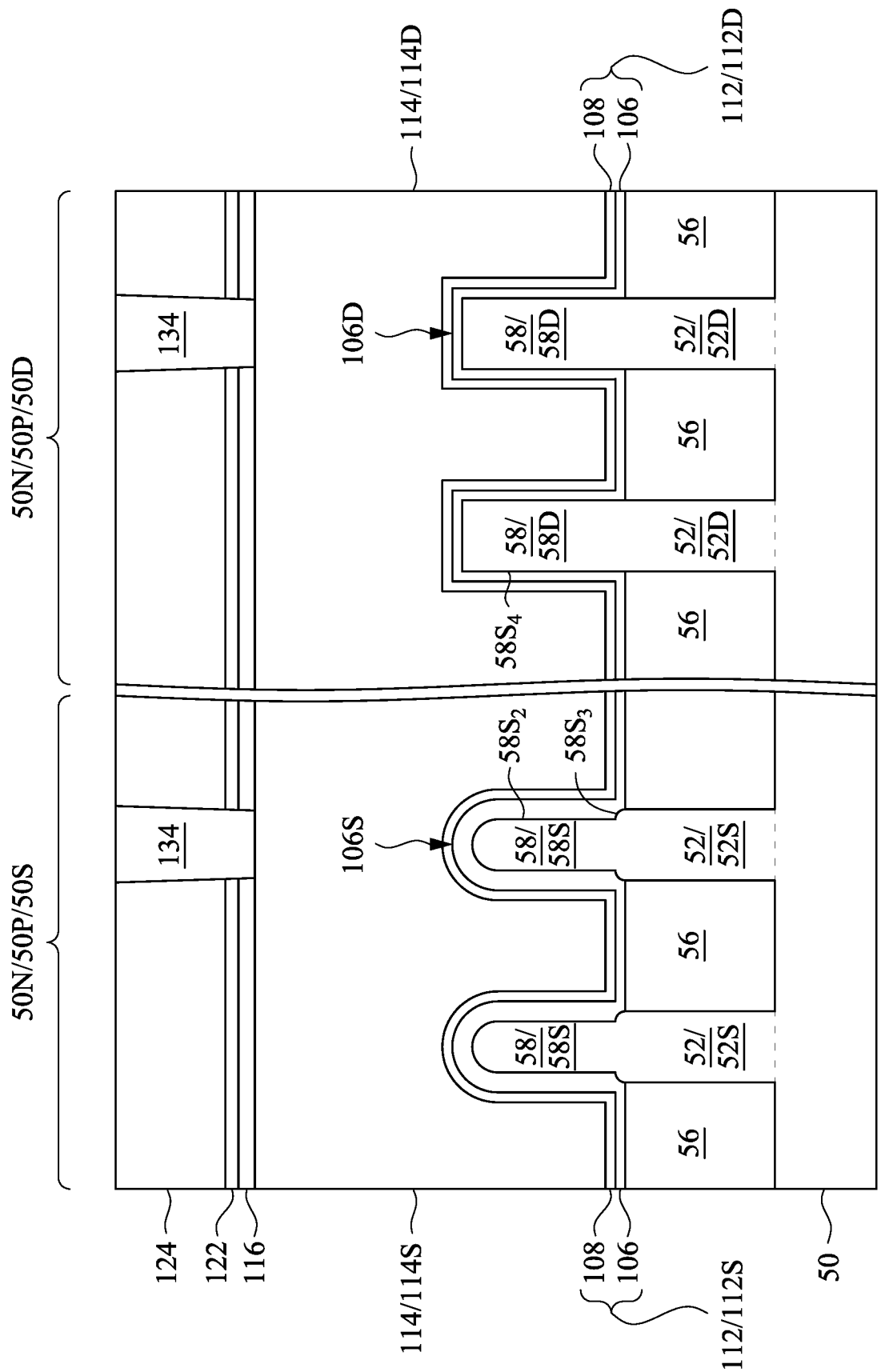
FIG. 20 is a view of FinFETs, in accordance with some embodiments.

FIG. 20 is a view of FinFETs, in accordance with some embodiments. This embodiment is similar to the embodiment described for FIG. 19A, except the top surfaces of the channel regions 58S in the sparse region 50S are convex after the anneal process. The top surfaces of the channel regions 58D in the dense region 50D are substantially flat (within process variations) after the anneal process. Additionally, in this embodiment, the stairstep surfaces $58S_3$ are convex.

Figure 21:
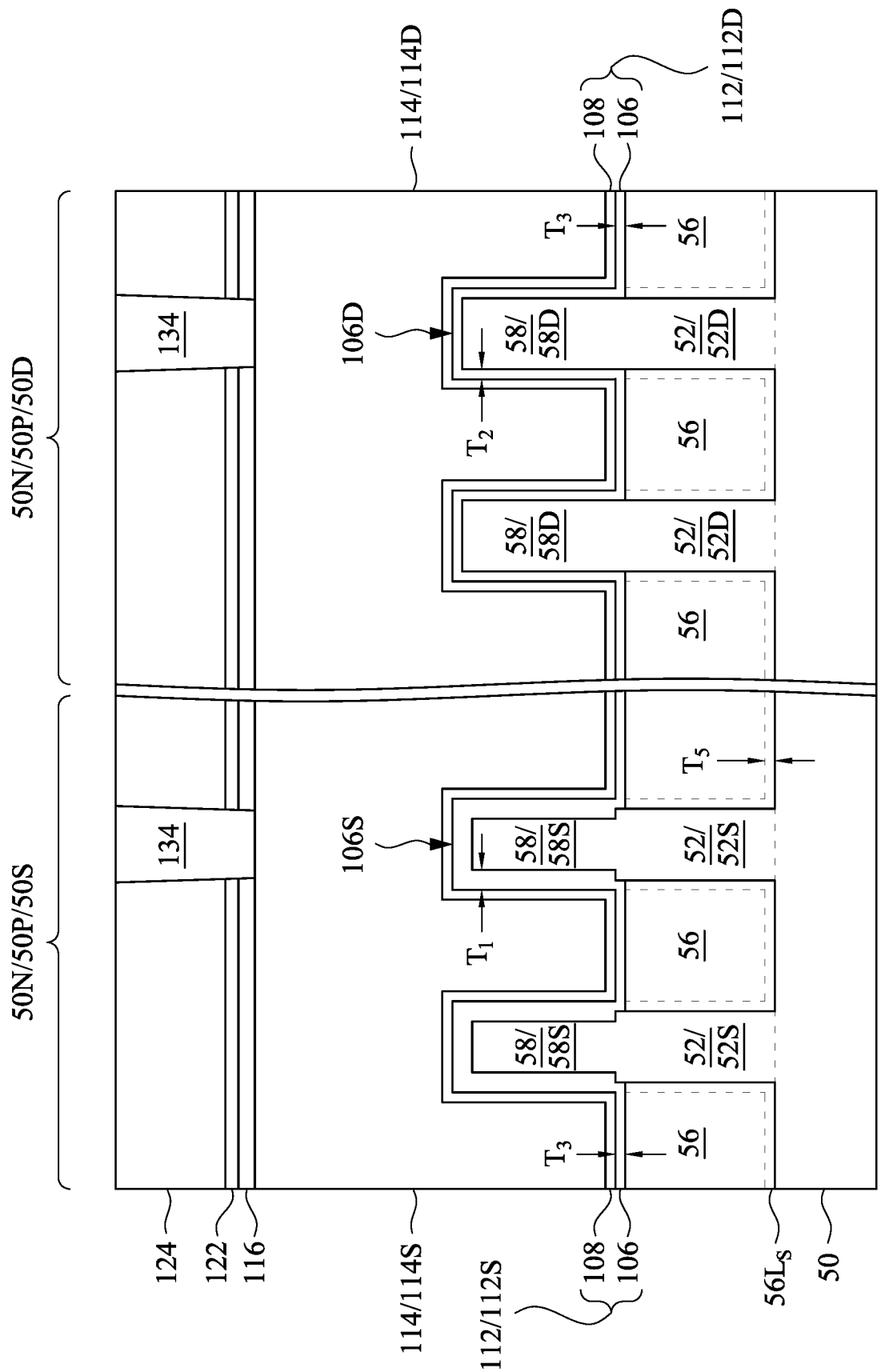
FIG. 21 is a view of FinFETs, in accordance with some embodiments.

FIG. 21 is a view of FinFETs, in accordance with some embodiments. This embodiment is similar to the embodiment described for FIG. 19A, except the STI regions 56 each include a single liner $56L_S$. The liner $56L_S$ may be formed of a nitride such as silicon nitride, silicon oxynitride, or the like. The thickness $T_5$ of the liner $56L_S$ is less than the thickness $T_1$ (previously described for FIGS. 13A-13B) of the portions of the interfacial layer 106S on the channel regions 58S, such that the sidewalls of the liner $56L_S$ are laterally offset from the sidewalls of the portions of the interfacial layer 106S on the channel regions 58S. The thickness $T_5$ of the liner $56L_S$ may be less than the thickness $T_2$ (previously described for FIGS. 13A-13B) of the portions of the interfacial layer 106D on the channel regions 58D, such that the sidewalls of the liner $56L_S$ are laterally offset from the sidewalls of the portions of the interfacial layer 106D on the channel regions 58D. The thickness $T_5$ of the liner $56L_S$ may be equal to the thickness $T_2$ of the portions of the interfacial layer 106D on the channel regions 58D, such that the sidewalls of the liner $56L_S$ are substantially aligned (within process variations) with the sidewalls of the portions of the interfacial layer 106D on the channel regions 58D. In some embodiments, the thickness $T_5$ of the liner $56L_S$ is in the range of 2 nm to 4 nm.

Figure 22:
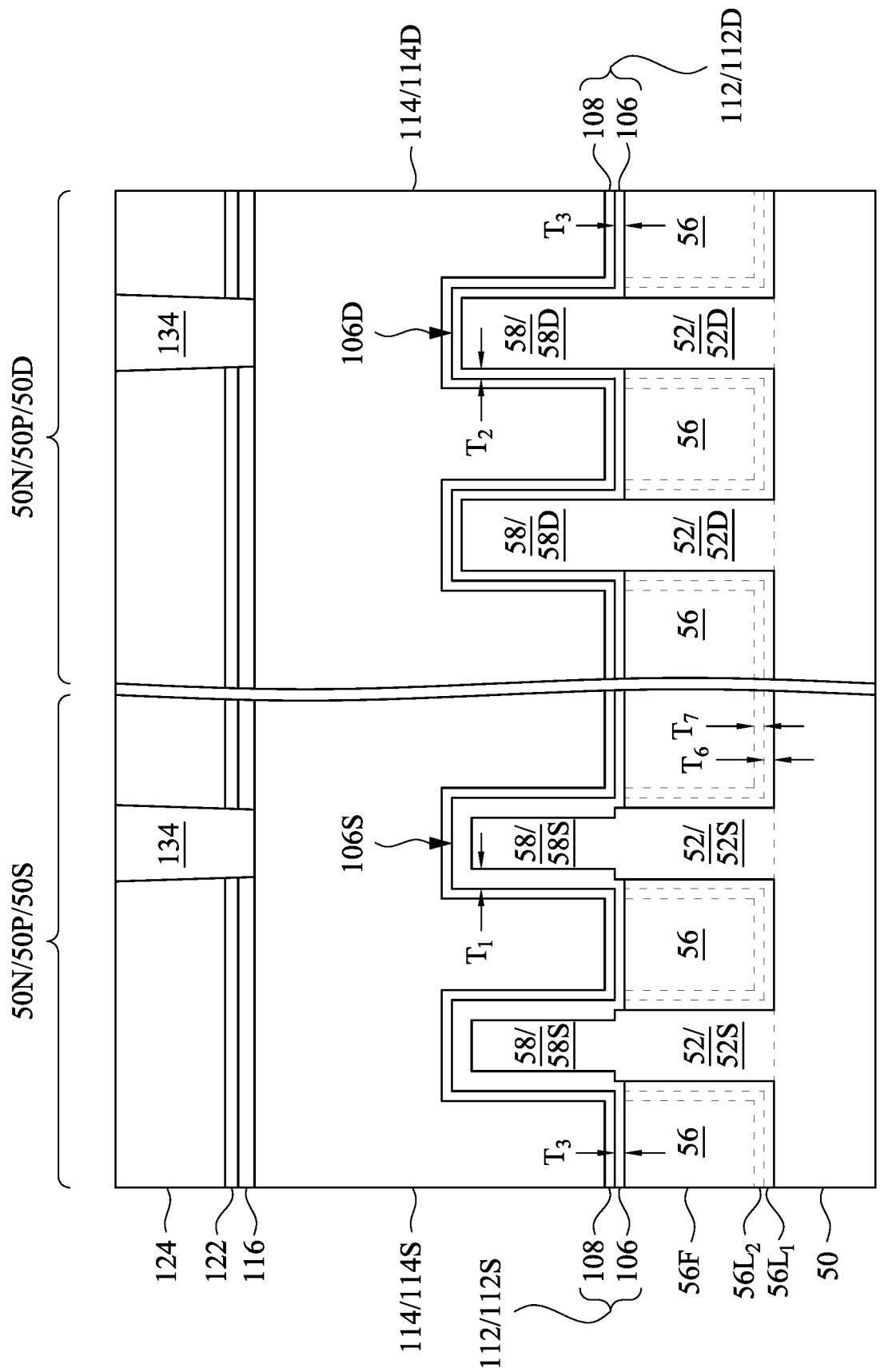
FIG. 22 is a view of FinFETs, in accordance with some embodiments.

FIG. 22 is a view of FinFETs, in accordance with some embodiments. This embodiment is similar to the embodiment described for FIG. 19A, except the STI regions 56 each include multiple liners 56L. For example, the liners 56L may include a first liner $56L_1$ and a second liner $56L_2$ on the first liner $56L_1$. The first liner $56L_1$ may be formed of a nitride such as silicon nitride, silicon oxynitride, or the like. The thickness $T_6$ of the first liner $56L_1$ is less than the thickness $T_1$ (previously described for FIGS. 13A-13B) of the portions of the interfacial layer 106S on the channel regions 58S, such that the sidewalls of the first liner $56L_1$ are laterally offset from the sidewalls of the portions of the interfacial layer 106S on the channel regions 58S. The thickness $T_6$ of the first liner $56L_1$ may be less than the thickness $T_2$ (previously described for FIGS. 13A-13B) of the portions of the interfacial layer 106D on the channel regions 58D, such that the sidewalls of the first liner $56L_1$ are laterally offset from the sidewalls of the portions of the interfacial layer 106D on the channel regions 58D. The thickness $T_6$ of the first liner $56L_1$ may be equal to the thickness $T_2$ of the portions of the interfacial layer 106D on the channel regions 58D, such that the sidewalls of the first liner $56L_1$ are substantially aligned (within process variations) with the sidewalls of the portions of the interfacial layer 106D on the channel regions 58D. In some embodiments, the thickness $T_6$ of the first liner $56L_1$ is in the range of 1 nm to 3 nm, and the thickness $T_7$ of the second liner $56L_2$ is in the range of 1 nm to 3 nm.

Figure 23:
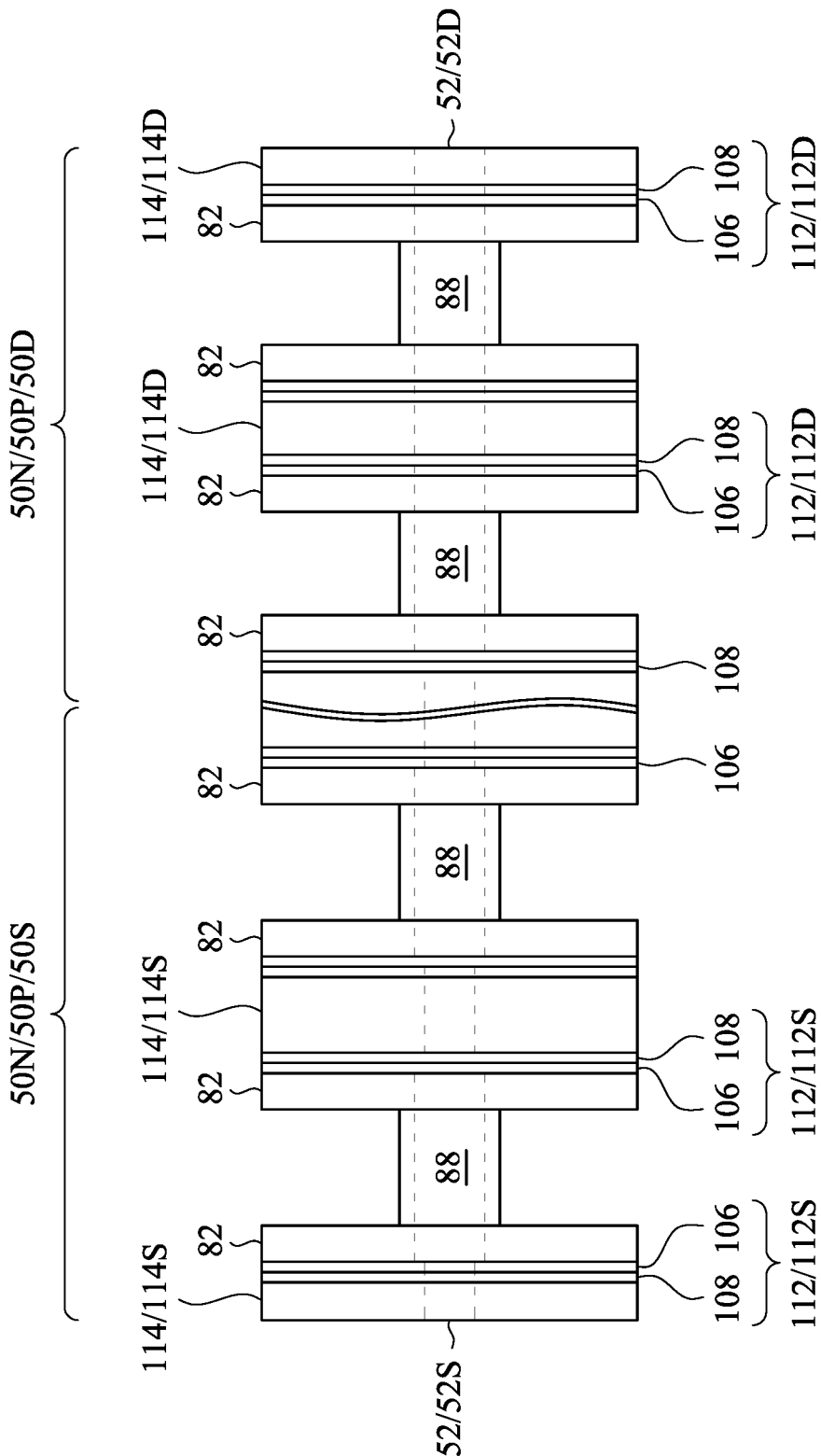
FIG. 23 is a view of FinFETs, in accordance with some embodiments.

FIG. 23 is a view of FinFETs, in accordance with some embodiments. FIG. 23 is a top-down view illustrating any of the FinFETs described for FIGS. 19A-19B, 20, 21, or 22. The fins 52 are shown in ghost and some features are omitted for clarity of illustration. As can be clearly seen in the top-down view, the width of the channel regions 58S in the sparse region 50S are less than the width of the channel regions 58D in the dense region 50D. Additionally, the other portions of the fins 52S in the sparse region 50S, such as the portions underlying the gate spacers 82, do not have a decreased width, such that the width of the channel regions 58S in the sparse region 50S is less than the width of the portions of the fins 52S underlying the gate spacers 82. The width of those other portions of the fins 52S are measured in a direction perpendicular to the longitudinal axes of the fins 52.

Embodiments may achieve advantages. Forming the replacement interfacial layers 106 during a gate replacement process instead of utilizing the dummy dielectrics 72 as interfacial layers allows the dummy dielectrics 72 to be replaced with higher quality interfacial layers, which may improve device performance when the dummy dielectrics 72 are damaged by processing. Additionally, manufacturing complexity may be reduced by avoiding patterning of the dummy dielectrics 72. Further, the dummy dielectrics 72 may be formed thinner than other types of dummy dielectrics, such as dummy dielectrics that are used as interfacial layers, allowing for a reduction in etching losses when removing the dummy dielectrics 72. Increasing the thickness $T_1$ of the portions of the interfacial layer 106S on the channel regions 58S can reduce the leakage current of the devices in the sparse region 50S, which may be advantageous when the devices in the sparse region 50S are devices that operate at a high voltage, such as input/output devices. The performance of the input/output devices may thus be improved.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

Further, the FinFET/NSFET devices may be interconnected by metallization layers in an overlying interconnect structure to form integrated circuits. The overlying interconnect structure can be formed in a back end of line (BEOL) process, in which the metallization layers are connected to the source/drain contacts 132 and the gate contacts 134. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process.

In an embodiment, a device includes: an isolation region on a substrate; a first semiconductor fin protruding above the isolation region; a first gate dielectric on a first channel region of the first semiconductor fin, the first gate dielectric including a first interfacial layer and a first high-k dielectric layer; a second semiconductor fin protruding above the isolation region; and a second gate dielectric on a second channel region of the second semiconductor fin, the second gate dielectric including a second interfacial layer and a second high-k dielectric layer, a first portion of the first interfacial layer on the first channel region having a greater thickness than a second portion of the second interfacial layer on the second channel region, the second channel region having a greater height than the first channel region. In some embodiments of the device, the first gate dielectric and the second gate dielectric are each disposed on the isolation region, and a third portion of the first interfacial layer on the isolation region has the same thickness as a fourth portion of the second interfacial layer on the isolation region. In some embodiments of the device, a first top surface of the first channel region is substantially flat, and a second top surface of the second channel region is substantially flat. In some embodiments of the device, a first top surface of the first channel region is substantially flat, and a second top surface of the second channel region is convex.

In some embodiments of the device, a side of the first semiconductor fin includes a first sidewall, a second sidewall, and an indented stairstep surface, the indented stairstep surface connecting the first sidewall to the second sidewall, the first interfacial layer extending along the first sidewall, the second sidewall, and the indented stairstep surface. In some embodiments, the device further includes: a first gate electrode on the first gate dielectric; and a second gate electrode on the second gate dielectric, the first gate electrode having a greater width than the second gate electrode.

In an embodiment, a device includes: a first semiconductor fin extending from a substrate, a side of the first semiconductor fin including a first sidewall, a second sidewall, and an indented stairstep surface, the indented stairstep surface connecting the first sidewall to the second sidewall; a first gate dielectric including a first interfacial layer extending along the first sidewall, the second sidewall, and the indented stairstep surface of the first semiconductor fin; a second semiconductor fin extending from the substrate, a side of the second semiconductor fin including a single sidewall; and a second gate dielectric including a second interfacial layer extending along the single sidewall of the second semiconductor fin. In some embodiments of the device, the indented stairstep surface is substantially flat. In some embodiments of the device, the indented stairstep surface is convex. In some embodiments of the device, the first gate dielectric is disposed on a first channel region of the first semiconductor fin, the second gate dielectric is disposed on a second channel region of the second semiconductor fin, and the second channel region has a greater height than the first channel region. In some embodiments, the device further includes: a first gate electrode on the first gate dielectric; and a second gate electrode on the second gate dielectric, the first gate electrode having a greater width than the second gate electrode.

In an embodiment, a method includes: depositing an interfacial layer on a first channel region and a second channel region of a semiconductor substrate; depositing a high-k dielectric layer on the interfacial layer; forming a capping layer on the high-k dielectric layer, the capping layer overlapping a first portion of the interfacial layer above the first channel region, a second portion of the interfacial layer above the second channel region being free of the capping layer, the capping layer including oxygen; driving the oxygen from the capping layer into the first portion of the interfacial layer by annealing the capping layer and the interfacial layer; and removing the capping layer. In some embodiments of the method, the interfacial layer is deposited directly on the first channel region and the second channel region, and no insulation materials separate the interfacial layer from the first channel region and the second channel region. In some embodiments of the method, driving the oxygen from the capping layer into the first portion of the interfacial layer increases a thickness of the first portion of the interfacial layer. In some embodiments of the method, driving the oxygen from the capping layer into the first portion of the interfacial layer decreases a width and a height of the first channel region. In some embodiments of the method, the capping layer includes a metal oxide. In some embodiments of the method, the capping layer is deposited to a thickness in a range of 1 nm to 10 nm. In some embodiments of the method, annealing the capping layer and the interfacial layer includes: annealing the capping layer and the interfacial layer at a temperature in a range of 400° C. to 1100° C. and for a duration in a range of 1 second to 300 seconds. In some embodiments of the method, removing the capping layer includes: etching the capping layer with an etching process that selectively etches a material of the capping layer at a faster rate than a material of the high-k dielectric layer. In some embodiments, the method further includes: forming a first gate electrode layer and a second gate electrode layer on the high-k dielectric layer, the first gate electrode layer overlapping the first portion of the interfacial layer, the second gate electrode layer overlapping the second portion of the interfacial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing an interfacial layer on a first channel region and a second channel region of a semiconductor substrate;
   depositing a high-k dielectric layer on the interfacial layer;
   forming a capping layer on the high-k dielectric layer, the capping layer overlapping a first portion of the interfacial layer above the first channel region, a second portion of the interfacial layer above the second channel region being free of the capping layer, the capping layer comprising oxygen;
   driving the oxygen from the capping layer into the first portion of the interfacial layer by annealing the capping layer and the interfacial layer, wherein a resulting first thickness of the first portion of the interfacial layer is greater than a second thickness of the second portion of the interfacial layer; and
   removing the capping layer, wherein after removing the capping layer, a first top surface of the first channel region is convex, and a second top surface of the second channel region is flat.

2. The method of claim 1, wherein the interfacial layer is deposited directly on the first channel region and the second channel region, and no insulation materials separate the interfacial layer from the first channel region and the second channel region.

3. The method of claim 1, wherein driving the oxygen from the capping layer into the first portion of the interfacial layer decreases a width and a height of the first channel region.

4. The method of claim 1, wherein the capping layer comprises a metal oxide.

5. The method of claim 1, wherein the capping layer is deposited to a thickness in a range of 1 nm to 10 nm.

6. The method of claim 1, wherein annealing the capping layer and the interfacial layer comprises:
   annealing the capping layer and the interfacial layer at a temperature in a range of 400° C. to 1100° C. and for a duration in a range of 1 second to 300 seconds.

7. The method of claim 1, wherein removing the capping layer comprises:
   etching the capping layer with an etching process that selectively etches a material of the capping layer at a faster rate than a material of the high-k dielectric layer.

8. The method of claim 1 further comprising:
forming a first gate electrode layer and a second gate electrode layer on the high-k dielectric layer, the first gate electrode layer overlapping the first portion of the interfacial layer, the second gate electrode layer overlapping the second portion of the interfacial layer.

9. A method comprising:
forming a recess exposing a first channel region and a second channel region by removing a dummy gate and a dummy dielectric from the first channel region and the second channel region, wherein the dummy dielectric has a first thickness before removing the dummy dielectric;
after removing the dummy gate and the dummy dielectric, forming an interfacial layer on the first channel region and the second channel region and in the recess, the first thickness of the dummy dielectric being less than a second thickness of the interfacial layer, the interfacial layer formed of a first dielectric material having a first dielectric constant;
depositing a high-k dielectric layer on the interfacial layer and in the recess, the high-k dielectric layer formed of a second dielectric material having a second dielectric constant that is higher than the first dielectric constant;
after depositing the high-k dielectric layer, increasing a thickness of a first portion of the interfacial layer on the first channel region by annealing the interfacial layer, wherein the thickness of the first portion of the interfacial layer is greater than a thickness of a second portion of the interfacial layer on the second channel region; and
forming a gate electrode layer on the high-k dielectric layer and in the recess.

10. The method of claim 9, wherein the first dielectric material is silicon oxide and the second dielectric material is hafnium oxide.

11. The method of claim 9, wherein forming the interfacial layer comprises performing a first atomic layer deposition process and depositing the high-k dielectric layer comprises performing a second atomic layer deposition process.

12. The method of claim 9, wherein the first channel region and the second channel region are parts of a first semiconductor fin and a second semiconductor fin, respectively, and annealing the interfacial layer forms an indented stairstep surface on a side of the first semiconductor fin.

13. The method of claim 9, further comprising:
before annealing the interfacial layer, forming a capping layer on the high-k dielectric layer; and
after annealing the interfacial layer, removing the capping layer.

14. The method of claim 13, wherein the capping layer is formed of an oxygen-containing material.

15. A method comprising:
removing a dummy gate and a dummy dielectric from a first channel region and a second channel region, the dummy dielectric having a first thickness;
after removing the dummy gate and the dummy dielectric, depositing an interfacial layer on the first channel region and the second channel region;
depositing a high-k dielectric layer on the interfacial layer;
forming a capping layer on the high-k dielectric layer, the capping layer overlapping a first portion of the interfacial layer above the first channel region, a second portion of the interfacial layer above the second channel region being free of the capping layer, the capping layer comprising oxygen;
increasing a second thickness of the first portion of the interfacial layer to larger than a third thickness of the second portion of the interfacial layer by driving the oxygen from the capping layer into the interfacial layer, wherein the third thickness of the second portion of the interfacial layer remains unchanged during the driving of the oxygen, wherein the second thickness and the third thickness are each different than the first thickness of the dummy dielectric before removing the dummy dielectric;
removing the capping layer; and
forming a gate electrode layer on the high-k dielectric layer.

16. The method of claim 15, wherein driving the oxygen from the capping layer into the interfacial layer comprises annealing the capping layer and the interfacial layer.

17. The method of claim 15, wherein increasing the second thickness of the first portion of the interfacial layer decreases a width and a height of the first channel region.

18. The method of claim 15, wherein after removing the capping layer, a first top surface of the first channel region is substantially flat, and a second top surface of the second channel region is substantially flat.

19. The method of claim 15, wherein after removing the capping layer, a first top surface of the first channel region is convex, and a second top surface of the second channel region is substantially flat.

* * * * *